(12) United States Patent
Sakano et al.

(10) Patent No.: US 7,054,786 B2
(45) Date of Patent: May 30, 2006

(54) OPERATION MONITORING METHOD FOR TREATMENT APPARATUS

(75) Inventors: Shinji Sakano, Nirasaki (JP); Tsuyoshi Sendoda, Oume (JP)

(73) Assignee: Tokyo Electron Limited, Tokyo-To (JP)

(*) Notice: Subject to any disclaimer, the term of this patent is extended or adjusted under 35 U.S.C. 154(b) by 0 days.

(21) Appl. No.: 10/332,011

(22) PCT Filed: Jul. 3, 2001

(86) PCT No.: PCT/JP01/05758

§ 371 (c)(1),
(2), (4) Date: Jun. 20, 2003

(87) PCT Pub. No.: WO02/03441

PCT Pub. Date: Jan. 10, 2002

(65) Prior Publication Data
US 2004/0254761 A1   Dec. 16, 2004

(30) Foreign Application Priority Data

Jul. 4, 2000   (JP) .............................. 2000-201729
Jul. 4, 2000   (JP) .............................. 2000-201731

(51) Int. Cl.
*G06F 19/00* (2006.01)

(52) U.S. Cl. ...................... 702/183; 702/179; 700/108; 700/121

(58) Field of Classification Search ................ 702/183, 702/179, 181, 182, 187, 185; 700/121, 108, 700/109, 110
See application file for complete search history.

(56) References Cited

U.S. PATENT DOCUMENTS

| 5,658,423 | A  | * | 8/1997  | Angell et al. ................... 438/9 |
| 5,691,642 | A  | * | 11/1997 | Dobkin ........................ 324/464 |
| 6,238,937 | B1 | * | 5/2001  | Toprac et al. ................... 438/9 |
| 6,351,683 | B1 | * | 2/2002  | Johnson et al. ............. 700/121 |
| 6,419,846 | B1 | * | 7/2002  | Toprac et al. .................. 216/60 |
| 6,521,080 | B1 | * | 2/2003  | Balasubramhanya et al. ...................... 156/345.24 |
| 6,535,785 | B1 | * | 3/2003  | Johnson et al. ............. 700/121 |
| 6,549,864 | B1 | * | 4/2003  | Potyrailo ...................... 702/81 |

(Continued)

FOREIGN PATENT DOCUMENTS

EP   0 660211   12/1994

(Continued)

OTHER PUBLICATIONS

Gibson et al., "Using Multivariate Nested Distributions to Model Semiconductor Manufacturing Processes", IEEE, 1999.*

(Continued)

*Primary Examiner*—Patrick J. Assouad
(74) *Attorney, Agent, or Firm*—Smith, Gambrell & Russell, LLP

(57) ABSTRACT

In an operation monitoring method according to the present invention, operation data of a plasma processing system (1) are detected for every wafer (W) by means of a plurality of detectors, and a principal component analysis using the operation data is carried out by means of a controller (10). An operation state of the plasma processing system (1) is evaluated by using the results of the principal component analysis.

30 Claims, 22 Drawing Sheets

U.S. PATENT DOCUMENTS

| | | | | |
|---|---|---|---|---|
| 6,564,114 B1* | 5/2003 | Toprac et al. | ................ | 700/121 |
| 6,582,618 B1* | 6/2003 | Toprac et al. | ................ | 216/59 |
| 6,590,179 B1* | 7/2003 | Tanaka et al. | ......... | 219/121.43 |
| 6,616,759 B1* | 9/2003 | Tanaka et al. | ................ | 118/63 |
| 6,627,463 B1* | 9/2003 | Sarfaty | ................ | 438/7 |
| 6,643,559 B1* | 11/2003 | Bell | ................ | 700/121 |
| 6,675,137 B1* | 1/2004 | Toprac et al. | ................ | 703/2 |
| 6,678,569 B1* | 1/2004 | Bunkofske et al. | ......... | 700/108 |
| 6,706,543 B1* | 3/2004 | Tanaka et al. | ................ | 438/14 |
| 6,711,503 B1* | 3/2004 | Haaland | ................ | 702/22 |
| 6,723,574 B1* | 4/2004 | Bailey et al. | ................ | 438/16 |
| 6,789,052 B1* | 9/2004 | Toprac | ................ | 703/2 |
| 6,853,920 B1* | 2/2005 | Hsiung et al. | ................ | 702/1 |
| 6,865,509 B1* | 3/2005 | Hsiung et al. | ................ | 702/182 |
| 2002/0062162 A1* | 5/2002 | Bunkofske et al. | ......... | 700/108 |
| 2002/0107858 A1* | 8/2002 | Lundahl et al. | ............ | 707/100 |
| 2002/0119660 A1* | 8/2002 | Sarfaty et al. | ............ | 438/689 |
| 2002/0119668 A1* | 8/2002 | Bell | ................ | 438/707 |
| 2003/0008507 A1* | 1/2003 | Bell et al. | ................ | 438/689 |
| 2003/0038112 A1* | 2/2003 | Liu et al. | ................ | 216/60 |
| 2003/0055523 A1* | 3/2003 | Bunkofske et al. | ......... | 700/108 |
| 2003/0109951 A1* | 6/2003 | Hsiung et al. | ............ | 700/108 |
| 2003/0144746 A1* | 7/2003 | Hsiung et al. | ................ | 700/28 |

FOREIGN PATENT DOCUMENTS

| | | | |
|---|---|---|---|
| JP | | 200040 | 8/1995 |

OTHER PUBLICATIONS

Tan et al., "Steady-State Regression Analysis and Optimization of Multivariable Plasma Etching System", IEEE, 1994.*

Wise, B. M., et al., "Development and Benchmarking of Multivariate Statistical Process Control Tools for a Semiconductor Etch Process: Impact of Measurement Selection and Data Treatment on sensitivity", Proc. IFAC Symp. On Fault detection, Supervision and Safety for Technical Process, (1997), vol. 1, pp. 35 to 42.

Lee, S.F., et al., "RTSPC: A Software Utility for Real-Time SPC and Tool Data Analysis", IEEE Transactions on Semiconductor Manufacturing, (1995), vol. 8, No. 1, pp. 17-25.

McDonald, C.J., "The Evolution of Intel's Copy EXACTLY Technology Transfer method", Intel Technology Journal Q4'98, (1998), retrieved from the Internet: <URL: http://developer.intel.com/technology/itj/q41998/articles/art_2.htm>.

International Preliminary Examination Report (PCT/IPEA/409) (translated) issued for PCT/JP01/05758.

Notification of Transmittal of Copies of Translation of the International Preliminary Examination Report (PCT/IB/338) issued for PCT/JP01/05758.

* cited by examiner

OPERATION MONITORING METHOD FOR TREATMENT APPARATUS

TECHNICAL FIELD

The present invention relates to a method for carrying out the monitoring of operation state, the evaluation of characteristics and so forth, in a processing system for, e.g. carrying out etching a semiconductor-wafer by means of plasma.

BACKGROUND ART

Semiconductor producing processes use various processing systems, such as semiconductor producing systems and inspection systems. These processing systems are designed to use various operation data to monitor their operation states. If the operation states are considered to be abnormal, it is necessary to diagnose causes. When diagnosing the causes, the various operation data are collected and analyzed for grasping the operation states of the processing systems, to examine the place of abnormality.

For example, a plasma processing system is used for etching, deposition or the like. For example, a plasma processing system of this type comprises top and bottom electrodes which are provided in parallel in a processing vessel, and is designed to apply a high frequency power to the bottom electrode and feed a process gas into the processing vessel to apply predetermined plasma-processing to an object to be processed, such as a semiconductor wafer. Then, the plasma processing system is designed to detect over thirty kinds of data, such as pressure in the processing vessel, voltage applied to the bottom electrode, and the supply flow rate of the process gas, by means of detectors, respectively, to utilize the respective detected values as operation data to monitor the operation state of the processing system.

However, if the processing system continues a predetermined processing for a long time, the operation state varies with time, or the operation state suddenly varies in some cases. In such cases, statistical data, such as mean, maximum, minimum and variance values, are separately obtained with respect to the operation data, such as the high frequency power, the flow rate of the process gas and the pressure of the process gas in the processing vessel, and the operation state of the processing system is evaluated on the basis of the respective statistical data. However, since the number of detectors is large, there is a problem in that it is complicated and takes a lot of time to obtain the statistical data with respect to the operation data of all the detectors to evaluate the operation data every detector.

For example, when new processing systems or processing systems after maintenance are evaluated, the trial run of each of the processing systems is carried out. Then, operation data obtained by the trial run are compared with operation data obtained by a corresponding detector of a processing system as a reference (which will be hereinafter referred to as a "reference processing system"), one by one as shown in FIGS. 11 through 15, and are analyzed. Therefore, there is a problem in that it takes a lot of time to evaluate such a processing system.

Then, for example, the plasma processing system of this type applies a high frequency power to the electrodes in the processing vessel and feeds a process gas into the processing vessel to produce plasma of the process gas in the processing vessel to carry out a predetermined plasma processing with respect to a object to be processed, such as a semiconductor wafer. In this case, the object is processed after a high frequency source for supplying the high frequency power is stabilized in accordance with the state in the processing vessel. However, immediately after the processing system is started, the high frequency source is unstable and is not stabilized for a long time until the high frequency source adapts itself to the state in the processing vessel.

For example, FIG. 23a is a graph showing the variation of a parameter (voltage) relating to the high-frequency waves of a matching circuit, and FIG. 23b is a graph showing the variation of a parameter (capacitance) of a capacitor characterizing the matched state of the matching circuit. Both of the parameters vary with time, so that it is difficult to determine the stable condition. For example, in the parameter shown in FIG. 23a, a peak appears at the beginning of a series of the wafers, but it is difficult to determine whether the parameter is stabilized. It also takes a lot of time until the inside of the processing vessel adapts itself to environment wherein the high frequency power has been applied, and the inside of the processing vessel is not stable for a long time. Therefore, it is conventionally determined by operator's experience and intuition whether the states of the high frequency source and the inside of the processing vessel are stabilized. FIGS. 8a and 8b show the results on an operating condition on which the amount of deposition is small, after the processing vessel is evacuated for four days after the system is provided with maintenance and inspected. This condition on which the amount of deposition is small will be described later.

Thus, there is no technique for objectively determining whether the high frequency source and inside of the processing vessel of the processing system are stabilized, and it must be relied on operator's experience and intuition. Since it is not possible to evaluate processing conditions for leading the processing system to its stable condition, the evaluation must be relied on trial-and-error.

When the processing system is provided with maintenance and inspected, consumable goods are exchanged, and cleaning is carried out. However, since the processing system is a precision instrument, it is required to pay close attention to the assembly of the processing system. For example, even if there is slight loosening of screwing for the respective parts of the high frequency source and in the processing vessel, or even if there are slight errors, such as errors in the mounting of part of parts, plasma is unstable. However, conventionally, if the processing system is operated without finding such errors, there is no technique for identifying the errors without opening and inspecting the processing system, so that it takes a lot of time to diagnose the causes.

DISCLOSURE OF THE INVENTION

The present invention has been made to solve the above described problems. It is an object of the present invention to provide a method capable of simply and surely carrying out the monitoring of an operation state of a processing system and the evaluation of performance thereof by statistically integrating a large number of operation data into a small number of data to analyze the integrated data.

In order to accomplish this object, according to the present invention, there is provided an operation monitoring method for monitoring an operation of a processing system by utilizing a plurality of detected values as operation data, the detected values being detected for every object to be processed by means of a plurality of detectors provided in the processing system, wherein a multivariate analysis using the operation data is carried out to evaluate an operation state of the processing system.

There is also provided an operation monitoring method for monitoring an operation of a plasma processing system by utilizing a plurality of detected values as operation data, the detected values being detected for every object to be processed by means of a plurality of detectors provided in the plasma processing system, the method comprising the steps of: obtaining previously a plurality of operation data with respect to a plurality of objects to be processed as references; carrying out a principal component analysis using the operation data; evaluating an operation state of the plasma processing system on the basis of results of the principal component analysis.

There is also provided n operation monitoring method for monitoring an operation of a processing system by utilizing a plurality of detected values as operation data, the detected values being detected for every object to be processed by means of a plurality of detectors provided in the processing system, the method comprising the steps of: dividing the operation data into relatively high contribution principal components and low contribution principal components; deriving a residual matrix of operation data belonging to the low contribution principal components; and evaluating an operation state of the processing system on the basis of a residual score obtained by the residual matrix.

There is also provided a processing system evaluating method for evaluating a difference in characteristics between a plurality of processing systems by utilizing a plurality of detected values as operation data, the detected values being detected for every object to be processed by means of a plurality of detectors provided in each processing system, the method comprising the steps of: obtaining first operation data for each of a plurality of objects to be processed by using a reference processing system; carrying out a multivariate analysis using the first operation data; obtaining second operation data for each of the objects to be processed by using a comparative processing system to be compared with the reference processing system; obtaining an analyzed result wherein the second operation data are adapted to results of the multivariate analysis; and comparing results of analysis based on the first operation data with the results of analysis based on the second operation data to evaluate a difference in performance between the processing systems.

There is also provided a processing system evaluating method for evaluating a difference in characteristics between a plurality of processing systems by utilizing a plurality of detected values as operation data, the detected values being detected for every object to be processed by means of a plurality of detectors provided in the processing systems, the method comprising the steps of: obtaining first operation data for each of the objects to be processed by using a reference processing system; carrying out a principal component analysis using the first operation data to derive a first residual matrix; obtaining second operation data for each of the objects to be processed by using a comparative processing system to be compared with the reference processing system; adapting the second operation data to results of the principal component analysis to derive a second residual matrix; and comparing the first residual matrix based on the first operation data with the second residual matrix based on the second operation data to evaluate a difference in performance between the processing systems.

It is another object of the present invention to provide an operation monitoring method for a processing system capable of optimizing processing conditions to be operated by objectively deciding a stable condition after starting the processing system. It is a further object of the present invention to provide an abnormality detecting method for a processing system capable of surely detecting abnormalities of the system without opening the system.

In order to accomplish this object, according to the present invention, there is provided a processing system monitoring method for measuring a plurality of electrical data of a high frequency source varying in accordance with a state in a processing system, by means of a measuring device, when a high frequency power is applied to an electrode in a processing vessel from the high frequency source for processing an object with plasma in the processing system, and for carrying out a multivariate analysis using the measured electrical data to detect a power application state of the high frequency source, the method comprising the steps of: measuring the electrical data as reference data when the power application state of the high frequency source is stabilized in accordance with the state in the processing vessel in a reference processing system; carrying out a multivariate analysis for reference using the obtained reference data; measuring successively the electrical data as comparative data in a comparative processing system to be monitored, after the system is started; carrying out a multivariate analysis for comparison using the obtained comparative data; and comparing a results of the multivariate analysis for comparison with a result of the multivariate analysis for reference to determine, on the basis of a difference therebetween, whether the power application state of the high frequency source in the comparative processing system reaches a stable condition in accordance with the state in the processing vessel.

There is also provided an abnormality detecting method for detecting an abnormality of a processing system by measuring a plurality of electrical data of a high frequency source varying in accordance with a state in the processing system, by means of a measuring device, when a high frequency power is applied to an electrode in a processing vessel from the high frequency source for processing an object with plasma in the processing system, and by carrying out a multivariate analysis using the measured electrical data to detect a power application state of the high frequency source, the method comprising the steps of: measuring the electrical data as reference data when the power application state of the high frequency source is stabilized in accordance with the state in the processing vessel in a normal reference processing system; carrying out a multivariate analysis for reference using the obtained reference data; measuring the electrical data as comparative data in a comparative processing system, the abnormality of which is to be detected; carrying out a multivariate analysis for comparison using the obtained comparative data; and comparing a result of the multivariate analysis for comparison with a result of the multivariate analysis for reference to detect the abnormality of the comparative processing system on the basis of a difference therebetween.

BEST MODE FOR CARRYING OUT THE INVENTION

The present invention will be described below on the basis of preferred embodiments shown in FIGS. 1 through 10 and 16 through 22c.

Figure 1:
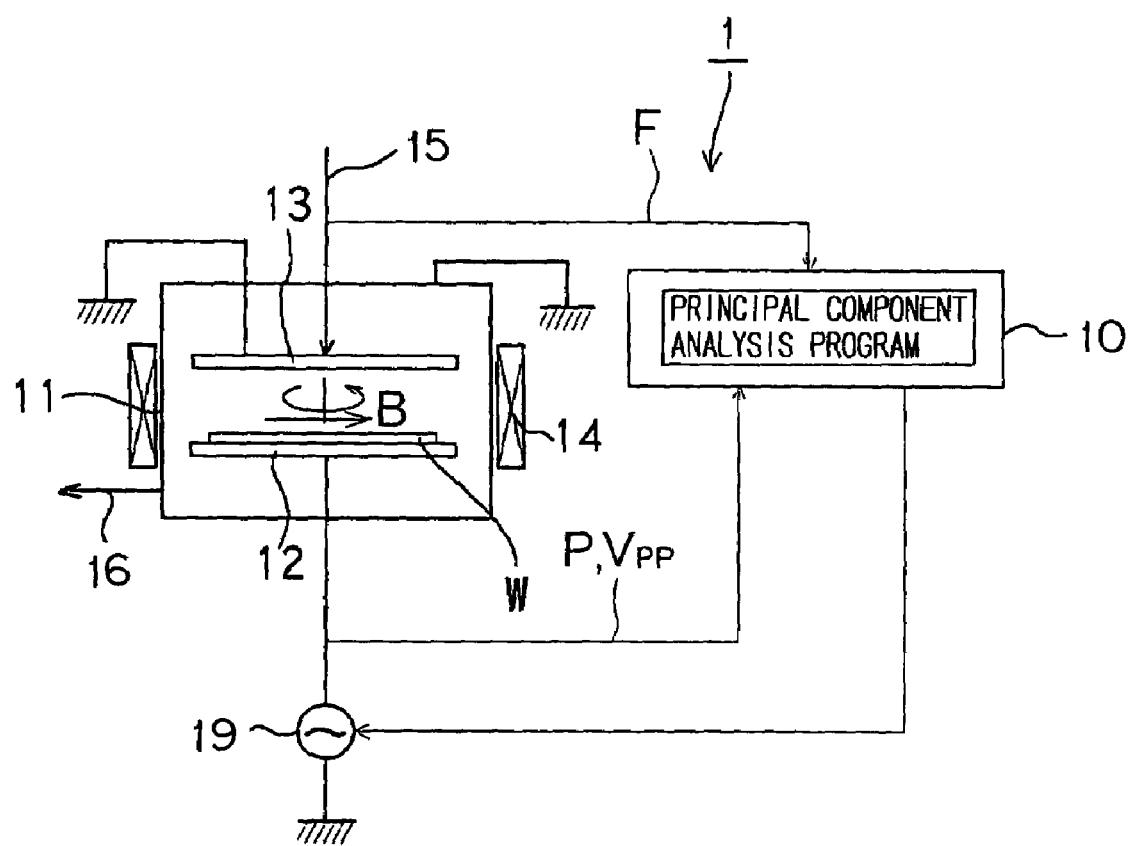
FIG. 1 is a block diagram showing an example of a plasma processing system to which an operation monitoring method according to the present invention is applied.

First, referring to FIG. 1, an example of a plasma processing system to which a method according to the present invention is applied will be described. A plasma processing system 1 shown in FIG. 1 comprises a processing vessel 11 of a conductive material, such as aluminum. In this processing vessel 11, a bottom electrode 12 also serving as a supporting table for supporting thereon a semiconductor wafer W serving as an object to be processed is provided on the bottom of the vessel. Above the bottom electrode 12, a top hollow grounded electrode 13 also serving as a process gas supply part is provided so as to be a part from the bottom electrode 12. A magnetic field forming means 14 for applying a rotating magnetic field is provided so as to surround the outer periphery of the processing vessel 11.

To the top face of the processing vessel 11, a gas supply pipe 15 communicated with the top electrode 13 is connected. Thus, a process gas is supplied from a gas supply source (not shown) into the processing vessel 11 via the gas supply pipe 15 and top electrode 13. To the side face of the processing vessel 11, a gas discharging pipe 16 connected to an evacuating unit (not shown) is connected. Thus, the pressure in the processing vessel 11 is reduced via the evacuating unit and gas discharging pipe 16 so that the pressure in the processing vessel 11 is held to be a predetermined degree of vacuum. A high frequency source 19 is connected to the bottom electrode 12 so as to apply a high frequency power to the bottom electrode 12 from the high frequency source 19.

The system 1 is designed to form high density plasma of a process gas in the processing vessel 11 by applying a rotating magnetic field B due to the magnetic field forming means 14, to an electric field produced between the top and bottom electrodes 13 and 12 under the control of a control unit 10. This plasma is intended to carry out a uniform plasma processing, such as a predetermined etching, with respect to the wafer W in the processing vessel 11.

For example, 36 kinds of detectors are mounted on the plasma processing system 1. By means of these detectors, for example, a high frequency voltage $V_{pp}$, a high frequency power P, a process gas flow rate F and so forth are sequentially detected as operation data during a plasma processing. These operation data are sequentially incorporated into the control unit 10, respectively. The control unit 10 stores therein, e.g. a principal component analysis program, as a multivariate analysis program, to carry out a principal component analysis by this program to monitor an operation state. That is, the control unit 10 is designed to monitor the operation state by evaluating the operation state of the system by using operation data, which are the detected values of the respective detectors, as parameters.

For example, when the principal component analysis is carried out in this preferred embodiment, a plurality of (e.g. 25) sample wafers serving as reference objects are previously etched. Then, the high frequency voltage $V_{pp}$, the high frequency power P, the process gas flow rate F and so forth are sequentially detected as operation data by means of the respective detectors every wafer to be processed. These data are standardized through a centering by subtracting a mean value and a scaling by dividing by a deviation every one of the voltage $V_{pp}$ and other kinds of data. At this time, the correspondence between the original operation data and standardized data has been clarified so as to correspond to, e.g. the sequence of data. For example, if n detected values exist with respect to each of m wafers, a matrix including standardized operation data is expressed by mathematical expression (1).

$$x = \begin{bmatrix} x_{11} & x_{12} & \cdots & \cdots & x_{1n} \\ x_{21} & x_{22} & \cdots & \cdots & x_{2n} \\ \cdots & \cdots & \cdots & \cdots & \cdots \\ \cdots & \cdots & \cdots & \cdots & \cdots \\ \cdots & \cdots & \cdots & \cdots & \cdots \\ x_{m1} & x_{m2} & \cdots & \cdots & x_{mn} \end{bmatrix} \quad (1)$$

Then, the control unit 10 calculates the mean, maximum, minimum and variance values of detected values every wafer. Then, a variance-covariance matrix based on these calculated values is used for carrying out a principal component analysis for a plurality of operation data to derive an eigenvalue and its eigenvector. The eigenvalue denotes the magnitude of variance of operation data, and is defined as first, second ... n-th principal components in order of the magnitude of eigenvalue. Each eigenvalue has an eigenvector belonging thereto. Usually, as the degree n of a principal component is higher, the contribution to the evaluation of data is lower, and its utility value is lower.

For example, when n detected values are taken with respect to each of m wafers, the j-th principal component corresponding to the j-th eigenvalue of the i-th wafer is expressed by mathematical expression (2).

$$T_{ij} = x_{i1}P_{j1} + x_{i2}P_{j2} + \ldots + x_{in}P_{jn} \quad (2)$$

Then, a value obtained by substituting the concrete i-th detected values ($x_{i1}, x_{i2}, \ldots, x_{in}$) for the j-th principal component $t_{ij}$ is a score of the j-th principal component of the i-th wafer. Therefore, the score $t_j$ of the j-th principal component is defined by mathematical expression (3), and the eigenvector $P_j$ of the j-th principal component is defined by mathematical expression (4).

$$t_j = \begin{bmatrix} t_{ij} \\ t_{2j} \\ \cdots \\ \cdots \\ t_{mj} \end{bmatrix} \quad (3)$$

$$P_j = \begin{bmatrix} P_{j1} \\ P_{j2} \\ \cdots \\ \cdots \\ P_{jn} \end{bmatrix} \quad (4)$$

The $t_j$ is a score denoting the relationship between measured values, and $P_j$ is an eigenvector denoting weights between measured values. Using a matrix X and the eigenvector $P_j$, the score $t_j$ of the j-th principal component is expressed by mathematical expression (5).

$$T_j = XP_j \quad (5)$$

Using the scores of principal components and their eigenvectors, the matrix X is expressed by mathematical expression (6):

$$X = t_1 P_1^T + t_2 P_2^T + \ldots + t_n P_n^T \quad (6)$$

wherein $P_n^T$ is a transposed matrix of $P_n$.

Therefore, even if various kinds of operation data exist, the principal component analysis can integrate them into a small number of statistical data of, e.g. the first and second principal components and the third principal component at most, and evaluate and grasp an operation state only by examining the small number of statistical data. For example, if the cumulative contribution of the eigenvalues of the first and second principal components exceeds 90%, the reliability of evaluation based on the first and second principal components is generally high. The first principal component denotes a direction in which operation data are most greatly distributed (varied) as described above, to be an index for comprehensively evaluating the operation state of the processing system, to be suitable for the decision and evaluation of the variation of the operation state of the processing system with time. The second principal component is distributed in a direction perpendicular to the first principal component, to be an index of an instantaneous shift from a normal operation state, to be suitable for the decision and evaluation of the sudden variation in operation state. If the same kind of wafer is processed by means of the same processing system, the eigenvalues and their eigenvectors of the first and second principal components are basically the same.

Therefore, in this preferred embodiment, a predetermined processing system is used for processing a plurality of sample wafers on predetermined conditions to derive eigenvalues and their eigenvectors on the conditions. Then, these eigenvalues and their eigenvectors are applied to actual wafers to decide and evaluate the operation state of the processing system during operation.

For example, in this preferred embodiment, the wafers are etched on the under-mentioned conditions and, at the same time, the principal component analysis of detected values of the respective detectors is carried out. In this principal component analysis, a variance-covariance value is used for deriving eigenvalues. The maximum eigenvalue is a first principal component having the maximum variance value. The eigenvector of the first principal component is derived by using the eigenvalue and a variance-covariance value. Then, the first principal component and a second principal component having the next magnitude are used for evaluating the operation state. If the first principal component score $t_1$ is derived and recorded every wafer with respect to 25 sample wafers when the processing system 10 is in a stable condition, corresponding to first through twenty-fifth wafers in FIG. 2. If the first principal component scores $t_1$ of 25 sample wafers are used for deriving a standard deviation σ of the first principal component scores $t_1$, all of the principal component scores $t_1$ of 25 wafers are within ±3 σ. If the first principal component scores $t_1$ are within ±3 σ, the plasma processing system can be regarded as being operated in a normal state.

[Processing Conditions]
Processing System: Magnetron RIE type Processing System
Wafer: 200 mm
Film to be etched: Silicon Oxide Film
Underlying Layer: Silicon Nitride Film
Processing Contents: SAC
Source High Frequency and
  Power for Bottom Electrode: 13.56 MHz, 1700 W
Gap between Electrodes: 27 mm
Processing Pressure: 53 mTorr
Process Gas: $C_4F_8$=16 sccm, CO=300 sccm, Ar=400 sccm Back Side Gas: He=7 Torr (Central Portion of Electrode), 40 Torr (Edge Portion of Electrode)

Electrostatic Chuck DC Voltage: 1.5 KV

Processing Temperature: Top Electrode=60° C., Side Wall=60° C.,

Bottom Electrode=20° C. After the 25 sample wafers are used for carrying out the principal component analysis as described above, wafers are actually etched on the same conditions, and operation data are detected by the respective detectors. Then, the operation data of the respective detector and the eigenvector of the first principal components obtained by the sample wafers are used for deriving a first principal component score every wafer. These first principal component scores are shown as those of the twenty-sixth wafer and thereafter. It can be seen from FIG. 2 that the first principal component scores belong to a normal operation range up to the one-hundred twentieth wafer, whereas the subsequent first principal component scores gradually deviate from the normal operation range. It is considered that the cause for this is that plasma by-products adhere and accumulate in the processing vessel to gradually vary the operating conditions as the number of processed wafers increases.

Figure 2:
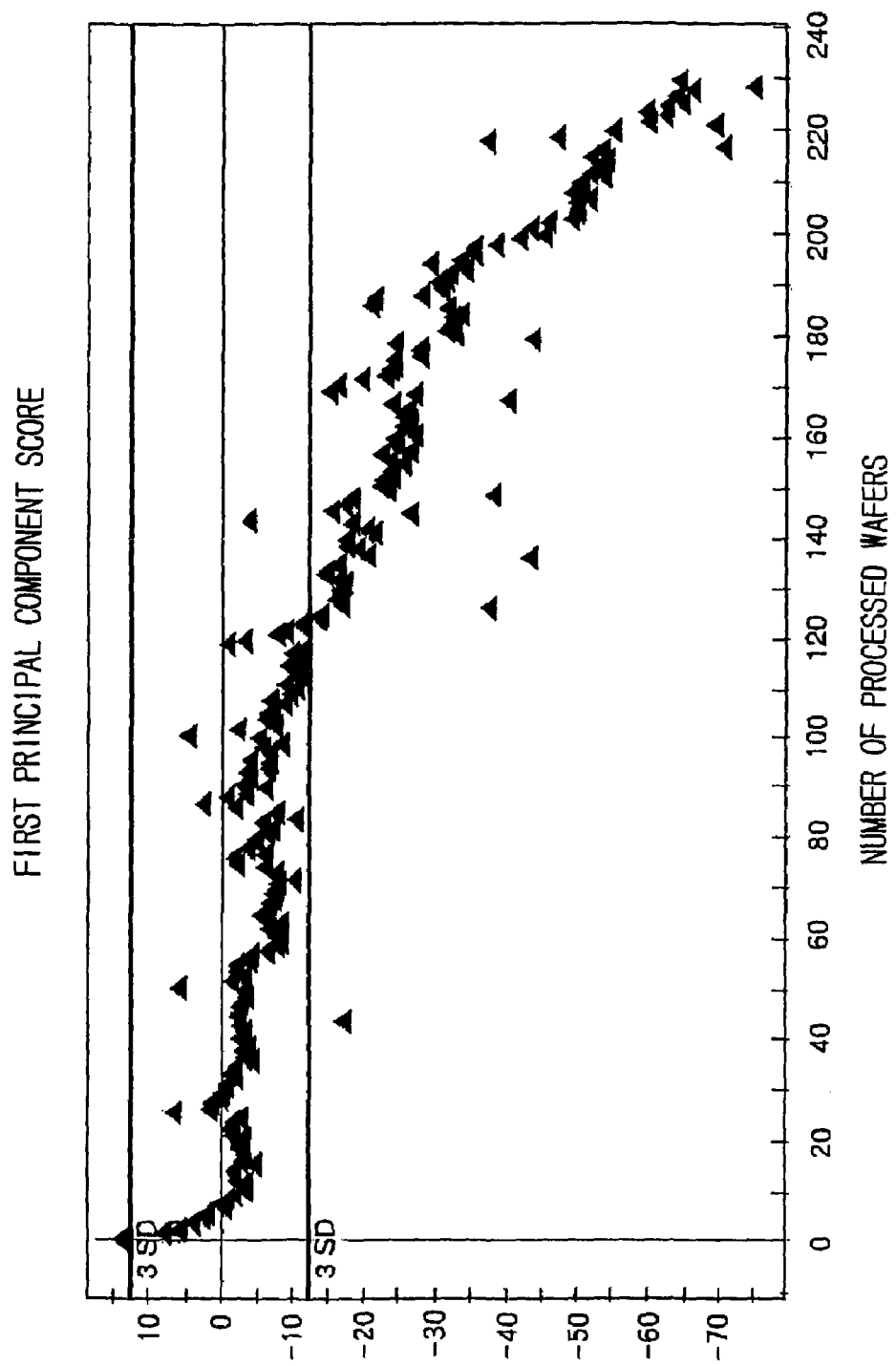
FIG. 2 is a graph showing the variation in first principal component score with respect to the plasma processing system shown in FIG. 1 obtained by a preferred embodiment of the present invention.
Figure 3:
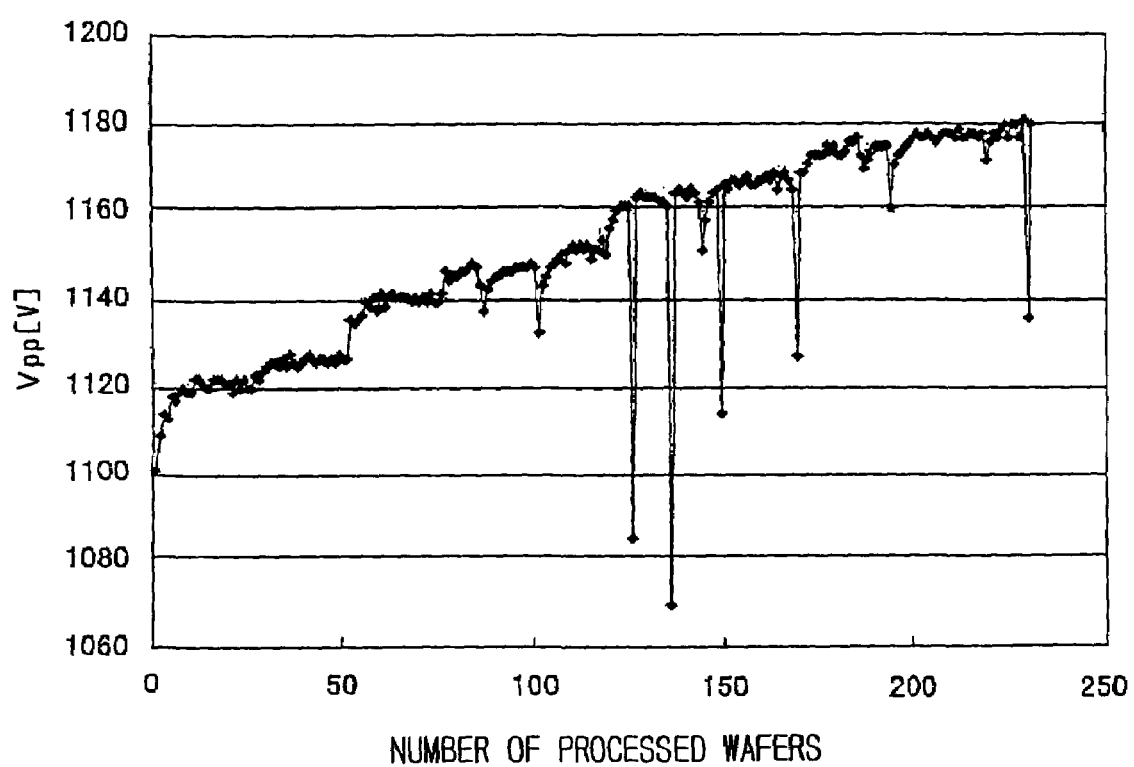
FIG. 3 is a graph showing the variation in high frequency voltage with respect to the plasma processing system shown in FIG. 1.

FIG. 3 is a graph showing the variation of high frequency voltage $V_{pp}$ with time during etching. It can be understood that the tendency for the high frequency voltage $V_{pp}$ to vary as shown in FIG. 3 is the same as the tendency for the first principal component score to vary as shown in FIG. 2. From this, it can be understood that the first principal component scores show the variation in operation state of the plasma processing system with time. Therefore, the operation is preferably stopped to carry out maintenance and so forth in a good timing after the first principal component scores deviate from the normal operation range.

As described above, according to this preferred embodiment, the operation state is evaluated by carrying out the principal component analysis being a multivariate analysis with respect to operation data previously detected with respect to the sample wafers. Therefore, unlike a conventional method wherein the semantic contents of all of detected values are individually compared and evaluated to observe the operation state, the principal component analysis of a large number of operation data can be automatically integrated into a small number of data including the first and second principal component scores to simply and accurately grasp the operation state even if the large number of operation data exist.

Since the first principal component scores in the principal component analysis are used for an operation monitoring technique, the variation in operation state with time can be grasped by the variation in first principal component score every wafer. By determining the shutdown time of the plasma processing system on the basis of a value ±three times as large as the standard deviation σ of the first principal component scores every wafer, the stop time of the plasma processing system, i.e. the maintenance time or the like, can be simply and surely grasped.

Figure 4:
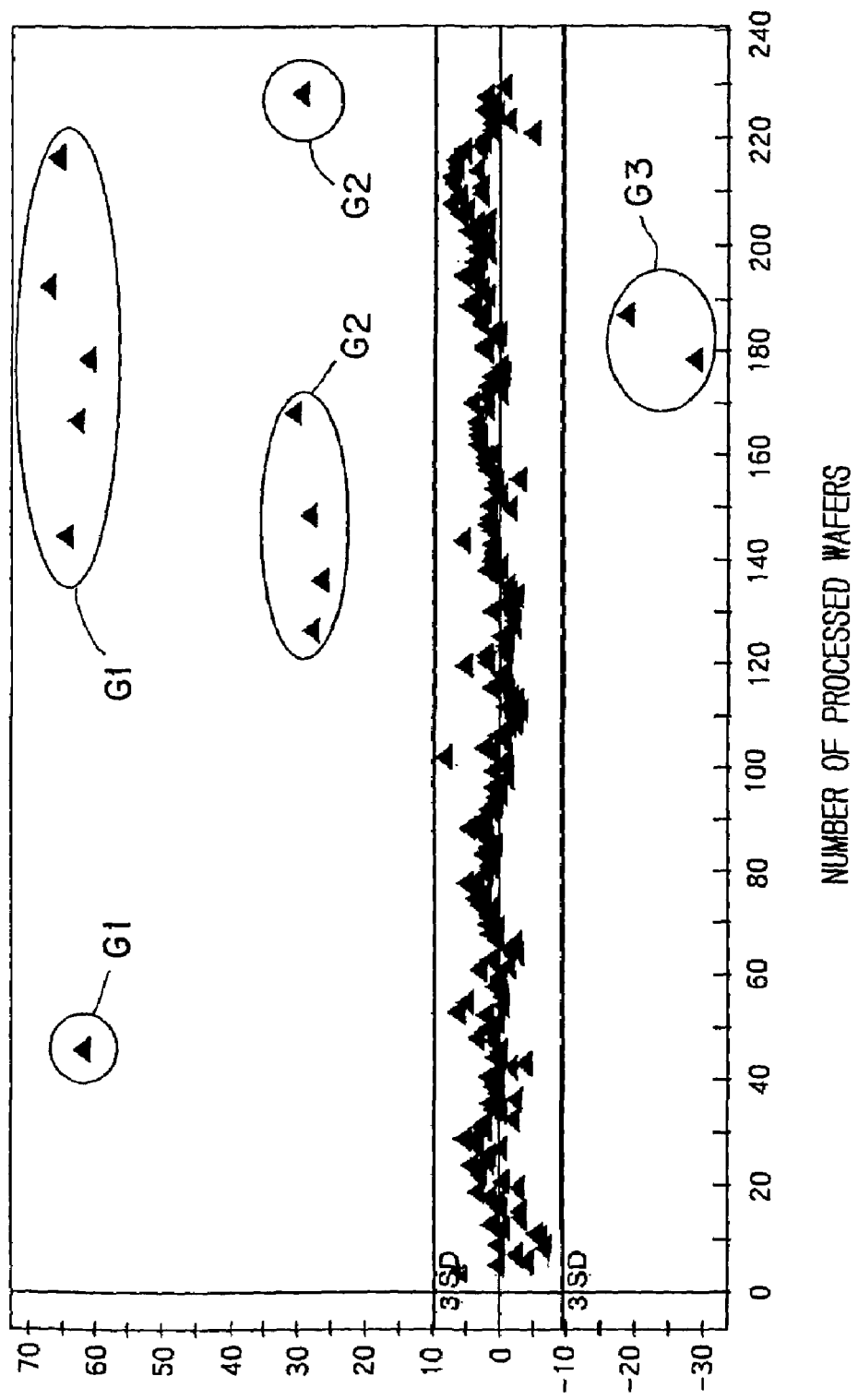
FIG. 4 is a graph showing the variation in second principal component score with respect to the plasma processing system shown in FIG. 1 obtained by a preferred embodiment of the present invention.

FIG. 4 shows second principal component scores when sample wafers and actual wafers are etched. When the second principal component score of the actual wafers is derived, the eigenvector of the second principal component obtained by the sample wafers is used. The variation of the second principal component scores is basically small, and the second principal component scores always stably concentrate in a range near zero. However, it can be seen that the second principal component scores suddenly vary to greatly deviate from the operation range in places. Although the second principal component scores do not greatly vary immediately after the start of etching, only one second principal component score greatly varies after 40 wafers are processed, and relatively many second principal component scores greatly vary after 120 wafers are processed. Since the magnitude of variation is divided into three groups, it is considered that the causes of variation are differing from one group to another.

Figure 5:
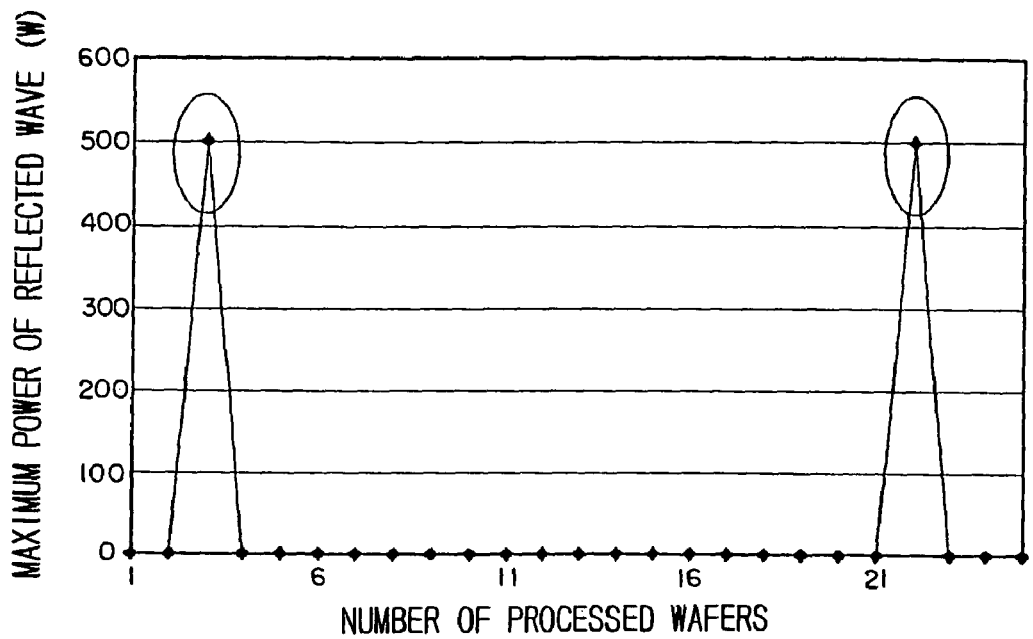
FIG. 5 is a graph showing the sudden variation in reflected wave of high frequency power relating to the second principal component scores shown in FIG. 4.
Figure 6:
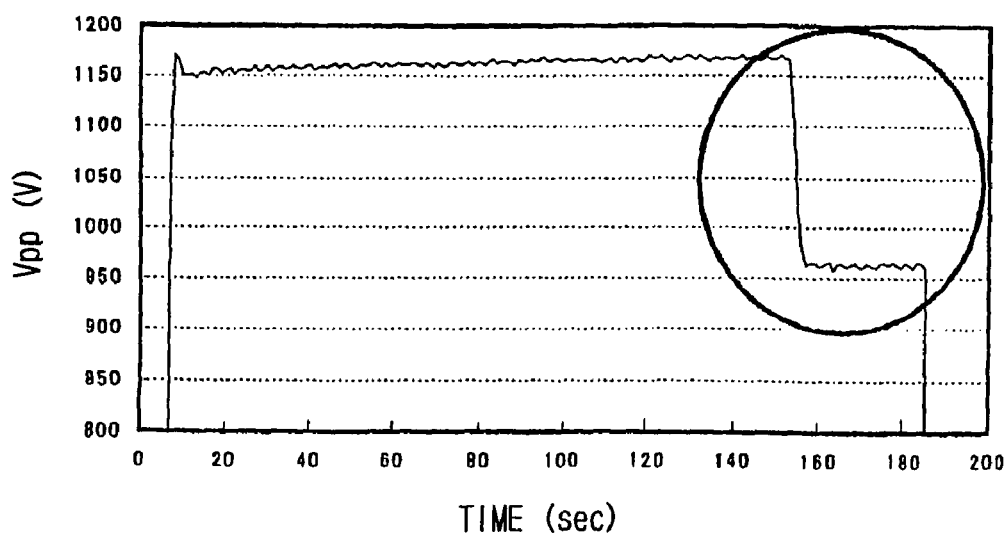
FIG. 6 is a graph showing the sudden variation in high frequency voltage relating to the second principal component scores shown in FIG. 4.
Figure 7:
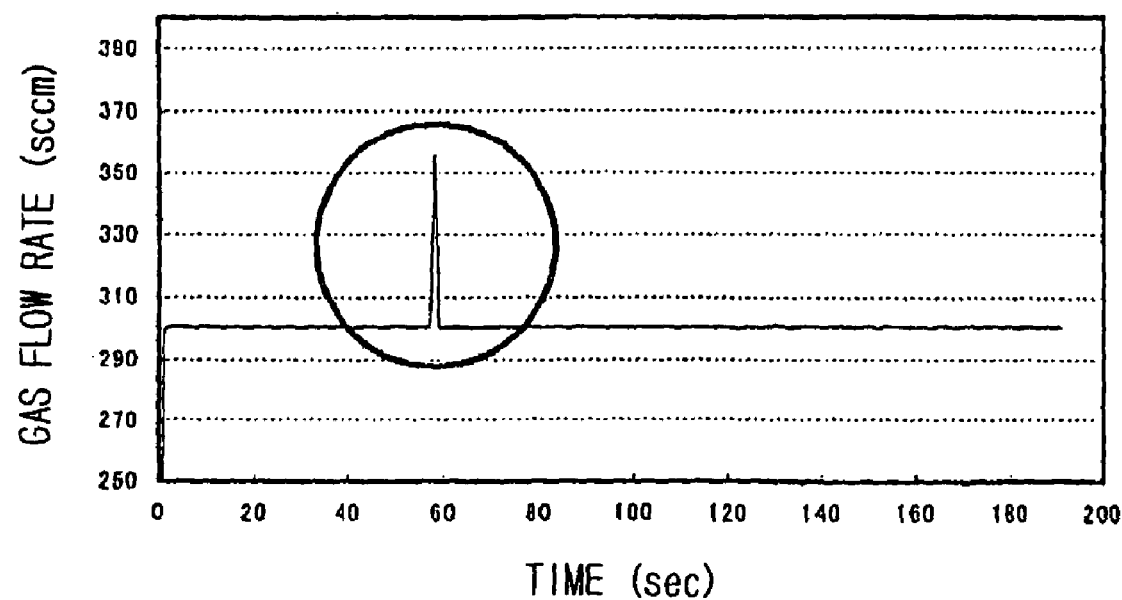
FIG. 7 is a graph showing the sudden variation in CO gas supply quantity relating to the second principal component scores shown in FIG. 4.

After the causes of variation for each group were examined, it was found that the first group G1 in which the variation is greatest in FIG. 4 corresponds to the sudden variation in reflected wave of the high frequency power in a range surrounded by ○ in FIG. 5 (the axis of abscissas in FIG. 5 shows the number of processed wafers in a lot and does not directly correspond to FIG. 4). It was found that the second group G2 corresponds to the sudden variation of the high frequency voltage $V_{pp}$ in a range surrounded by ○ in FIG. 6 (the axis of abscissas in FIG. 6 shows the time during the processing of a single wafer). It was found that the third group G3 corresponds to the sudden variation of the flow rate of CO gas of the process gases in a range surrounded by ○ in FIG. 7 (the axis of abscissas in FIG. 7 shows the time during the processing of a single wafer).

By thus using the second principal component scores every wafer, if a wafer having a suddenly varying second principal component score is found, if only each of detected values of the wafer is verified, it is possible to simply recognize that any one of the detected values is abnormal.

In this preferred embodiment, the variation in operation state which can not be sufficiently grasped by the first and second principal components can be more surely grasped by the following technique. For example, if the cumulative contribution up to the k-th principal component having a high contribution exceeds 90%, the variation in operation state can be determined and evaluated by carrying out the principal component analysis, but the leakage of grasp may be 10% at the maximum. Therefore, a residual matrix E defined by mathematical expression (7) wherein lower contribution principal components of order higher than (k+1) are integrated into one is prepared (components of rows correspond to detected values of detectors, respectively, and components of columns correspond to the numbers of wafers, respectively).

$$E = \begin{bmatrix} e_{11} & e_{12} & \cdots & \cdots & e_{1n} \\ e_{21} & e_{22} & \cdots & \cdots & e_{2n} \\ \cdots & \cdots & \cdots & \cdots & \cdots \\ \cdots & \cdots & \cdots & \cdots & \cdots \\ \cdots & \cdots & \cdots & \cdots & \cdots \\ e_{m1} & e_{m2} & \cdots & \cdots & e_{mn} \end{bmatrix} \quad (7)$$

If this residual matrix is adapted to the mathematical expression (6), the mathematical expression (6) is expressed by mathematical expression (8).

$$X = t_1 P_1^T + t_2 P_2^T + \ldots + t_k P_k^T + E \quad (8)$$

The residual score $Q_i$ of this residual matrix E is defined by mathematical expression (10) using a row vector $e_i$ defined by mathematical expression (9), and denotes residuals (errors) from respective detected values of the i-th wafer:

$$e_i = [e_{i1} e_{i2} \ldots e_{in}] \quad (9)$$

$$Q_i = e_i e_i^T \quad (10)$$

wherein $e_i$ denotes the i-th measurement.

That is, the residual score $Q_i$ is expressed as the product of a row vector $e_i$ and its transposed vector $e_i^T$, and is the sum of squares of the respective residuals so as to be capable of being surely derived as a residual without setting plus components off against minus components.

By deriving this residual score Q, the operation state can be multilaterally determined and evaluated. Since the eigenvectors of the first and second principal components are determined if only the first and second principal components are used, the operation data (detected values) of the respective detectors can not be multilaterally evaluated. On the other hand, the weight of the respective detected values serving as statistical data can be multilaterally evaluated by deriving the residual matrix E, so that it is possible to grasp the variation in operation state which can not be sufficiently grasped by the lower-order of first to k-th components. Therefore, when the residual score $Q_i$ of a certain wafer deviates from the residual score $Q_0$ of the sample wafer, if the components of the row vector $e_i$ is viewed, it is possible to determine whether any one of detected values for the wafer greatly deviates during the processing of the wafer, so that it is possible to identify the cause of abnormality.

For example, if the cumulative contributions of the eigenvalues of the first and second principal components exceed 90%, the first and second principal components can be used for determining the variation in operation state with time and the sudden variation therein, and the variation which can not be sufficiently grasped by the first and second principal components can be grasped by the residual score $Q_i$. If k=2, the first and second principal components and the residual matrix E are used, so that the mathematical expression (8) is expressed by mathematical expression (11).

$$X = t_1 P_1^T + t_2 P_2^T + E \quad (11)$$

Figure 8:
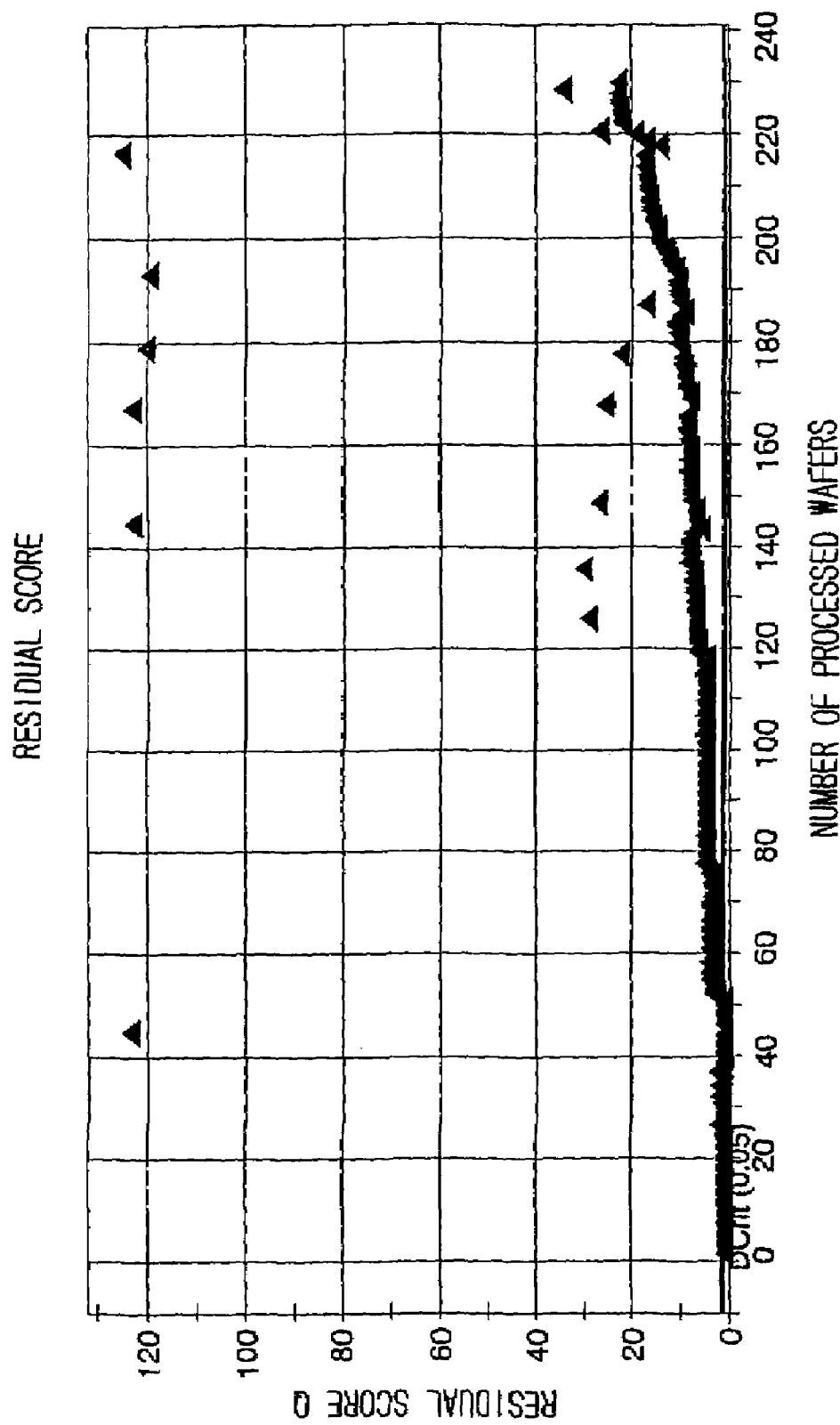
FIG. 8 is a graph showing a varying state of residual scores every wafer.

FIG. 8 shows the recording of residual scores $Q_i$ every wafer when wafers are processed on the above described processing conditions. It can also be clearly seen from FIG. 8 that, similar to the first principal components $t_i$, the residual scores $Q_i$ show a tendency to vary as the number of processed wafers increases. It can also be seen that, similar to the second principal component scores, the residual scores $Q_i$ suddenly vary. Thus, if the residual scores Q are grasped, phenomena capable of being grasped by the first and second principal components can also be grasped, and phenomena capable of being not sufficiently grasped by the first and second principal components can be multilaterally grasped. Then, if a parameter (operation data) having a particularly larger residual than other parameters is noted in a row corresponding to a certain wafer in the residual matrix E, it is possible to precisely verify which one of detected values for the wafers is abnormal.

As described above, when the respective scores of the first and second principal components are derived on the basis of operation data, operation data having a small residual other than these principal components are integrated to be derived as a residual score Q. Thus, the respective detected values can be multilaterally grasped, and the variation easy to fail to be noticed by the first and second principal scores can be surely grasped, so that the operation state can be grasped in detail. With respect to a wafer wherein abnormality has been found by the residual scores Q, if the row components of the residual matrix E are analyzed, it is possible to recognize which detected value of a detector is abnormal.

Second Preferred Embodiment

In the preceding preferred embodiment, there has been described a method for evaluating an operation state by a principal component analysis when wafers are processed by a processing system. This method can also be used for determining and evaluating the individual difference (the difference in characteristics, such as performance) between processing systems. That is, in this preferred embodiment, the residual score Q is used for grasping the difference in characteristics between processing systems. As described above, the residual score Q can be used for multilaterally grasping the variation in each detected value and for identifying the varying detected values.

For example, a reference processing system is first used for processing 25 wafers, and the detected values of a plurality of detectors are obtained as first operation data similar to the preceding preferred embodiment. These first operation data are used as parameters for carrying out a multivariate analysis to derive a residual matrix E and its residual score $Q_0$. Then, characteristics of the reference processing system are grasped on the basis of the residual score $Q_0$. Then, as described above, the value of the residual score $Q_0$ of the reference processing system is utilized as a reference value when characteristics of another processing system (a comparative processing system) to be compared therewith are determined and evaluated.

That is, after the residual score $Q_0$ of the reference processing system is obtained, the comparative processing system is used for processing wafers on the same conditions as those of the reference processing system to obtain detected values of the respective detectors as second operation data. Then, the second operation data obtained by the comparative processing system are adapted to the above described mathematical expression (11), which is previously used for obtaining the residual score $Q_0$ for the reference processing system, so that the residual score Q of the comparative processing system is derived. Next, the residual score Q of the comparative processing system is compared with the residual score $Q_0$ of the reference processing system to verify whether the former value is coincident with the latter value. If the residual score Q of the comparative processing system deviates from the residual score $Q_0$ of the reference processing system, it can be seen that at least one of detected values of the comparative processing system deviates from the reference value. In this preferred embodiment, rows of the residual matrix E comprises residuals of the respective detectors every wafer in the processing system.

Figure 9:
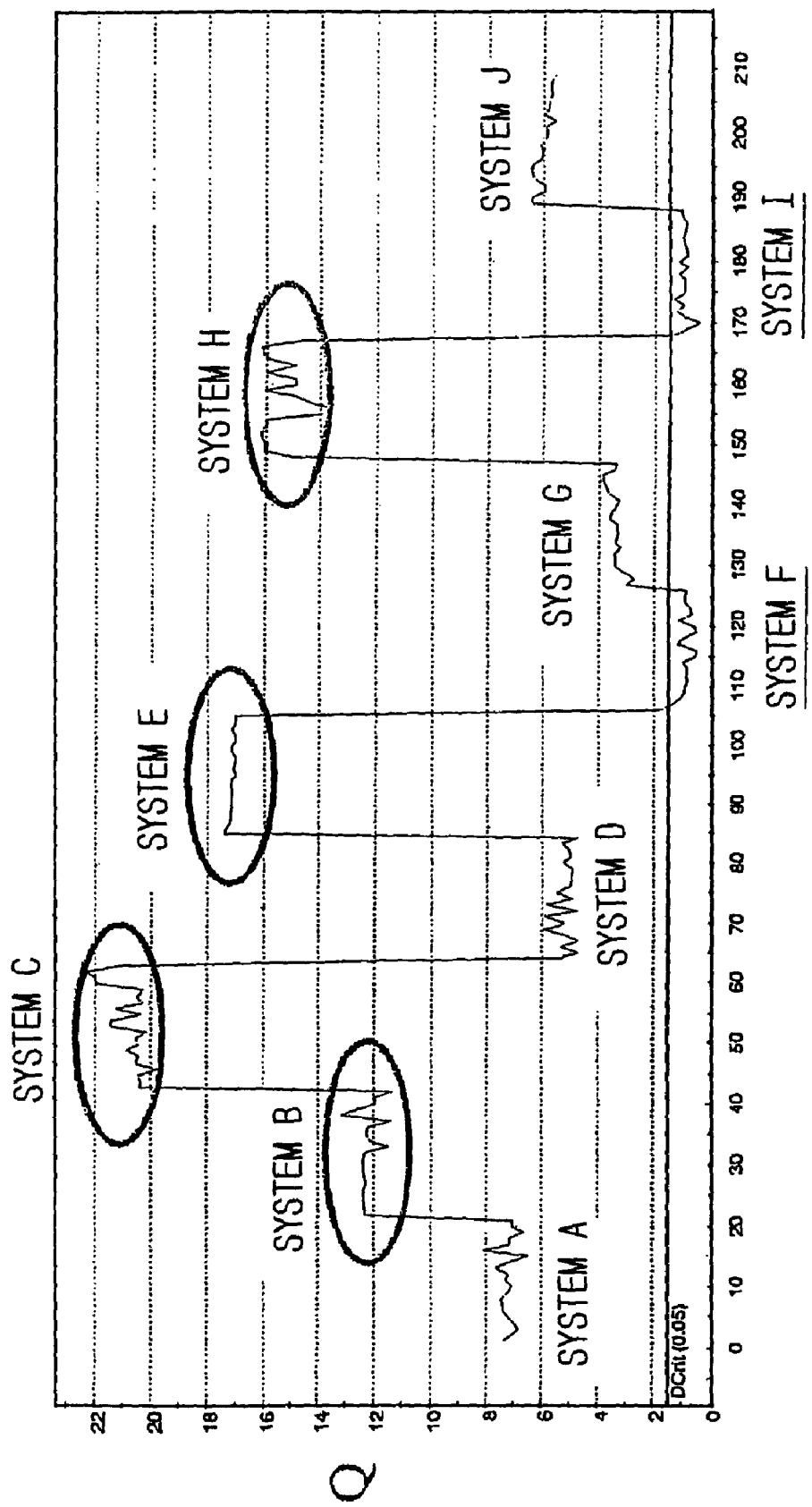
FIG. 9 is a graph showing residual scores of reference and comparative processing systems obtained by a preferred embodiment of a method for evaluating a processing system according to the present invention.

In this preferred embodiment, as shown in FIG. 9, systems F and I are used as reference processing systems for etching 25 wafers on the same conditions as those in the preceding preferred embodiment. Then, first operation data being detected values of the respective detectors of the reference processing systems F and I are used as parameters for carrying out a principal component analysis similar to the preceding preferred embodiment to derive eigenvalues and eigenvectors of first and second principal components and to derive a residual score Q. Then, constants, such as the eigenvalues and eigenvectors obtained by the principal component analysis with respect to the reference processing systems F and I are set in a main principal analysis program for comparative processing systems A to E, G, H and J. Then, the comparative processing systems A to E, G, H and J are used for etching wafers on the same conditions, and detected values of the respective detectors are obtained as second operation data. The results of residual scores Q derived every processing system are shown in FIG. 9. In order to obtain the residual scores Q, the above described mathematical expression (10) is used.

Figure 10:
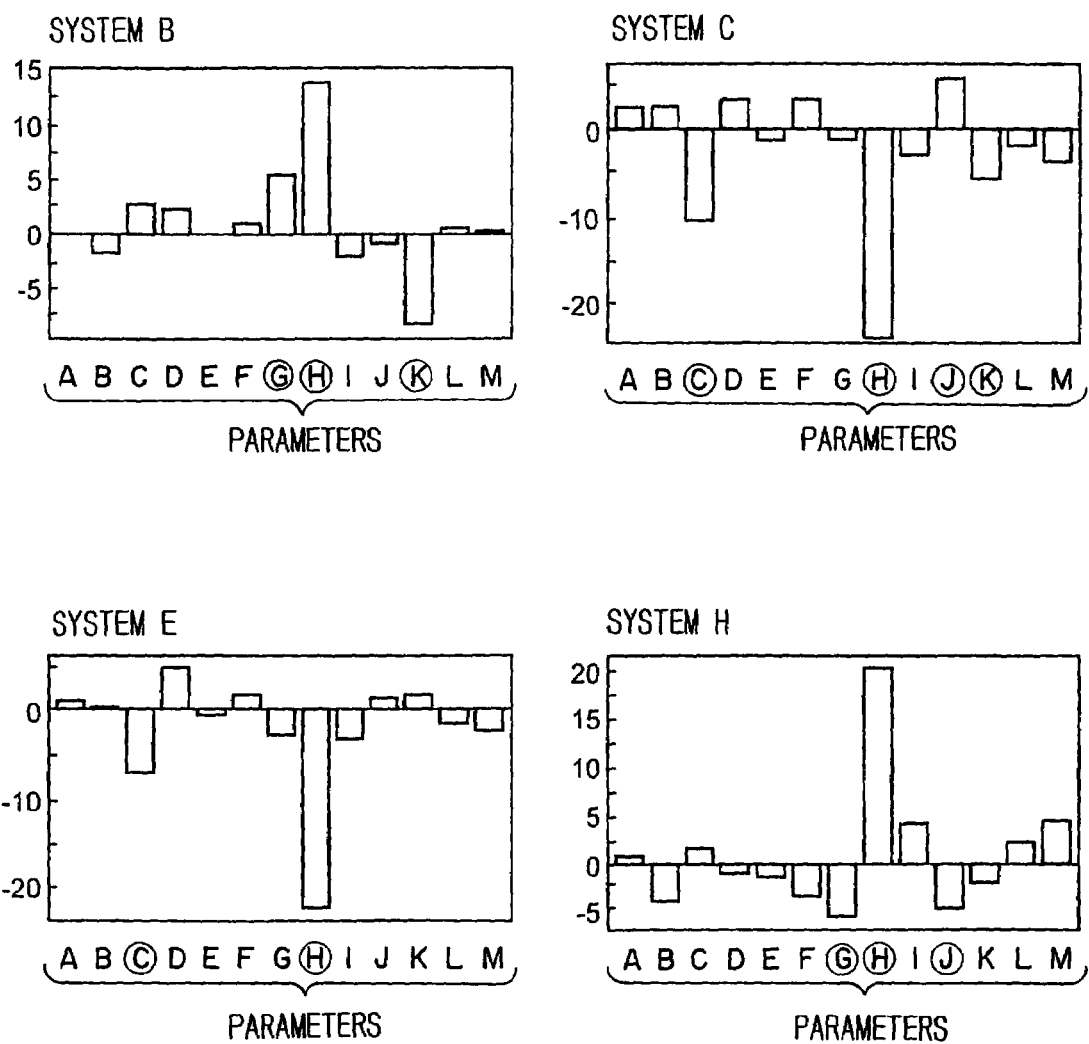
FIG. 10 is a graph showing residuals of parameters of a comparative processing system in which a residual scores are shifted from those in a reference processing system, of the graph shown in FIG. 9.
Figure 11:
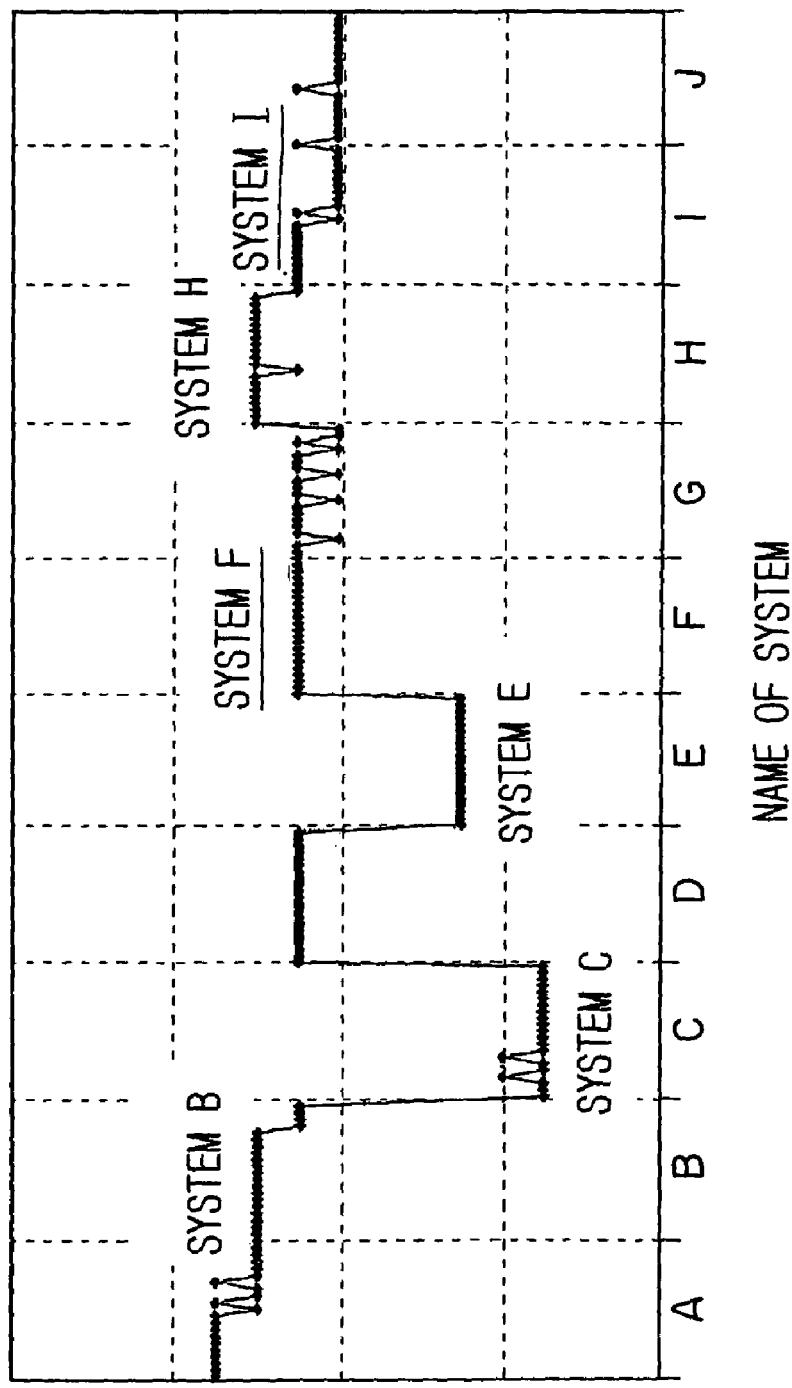
FIG. 11 is a graph showing the difference in parameter between processing systems used when the different points in performance between processing systems are conventionally compared and studied.
Figure 12:
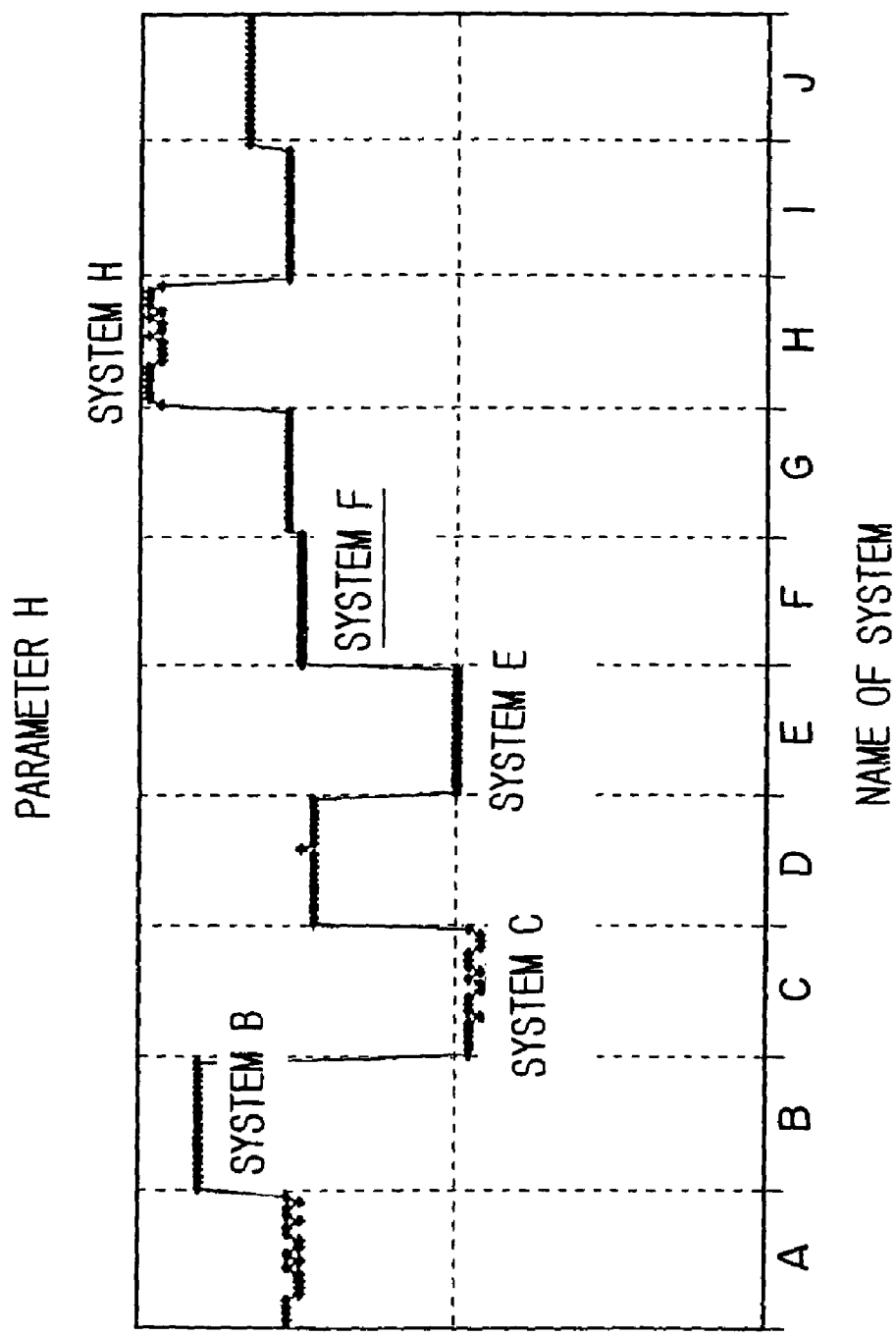
FIG. 12 is a graph corresponding to FIG. 11, which shows another parameter.
Figure 13:
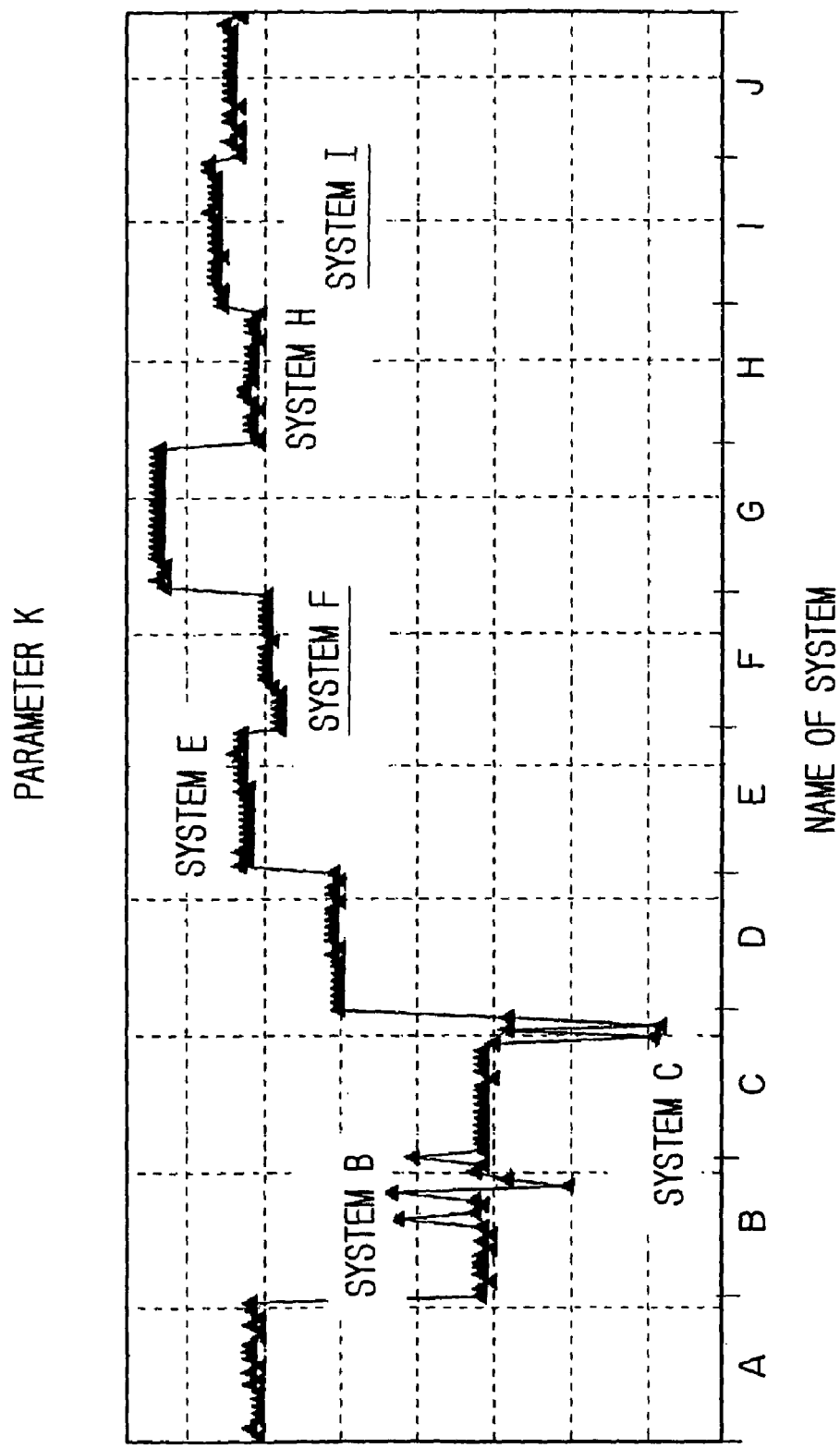
FIG. 13 is a graph corresponding to FIG. 11, which shows another parameter.
Figure 14:
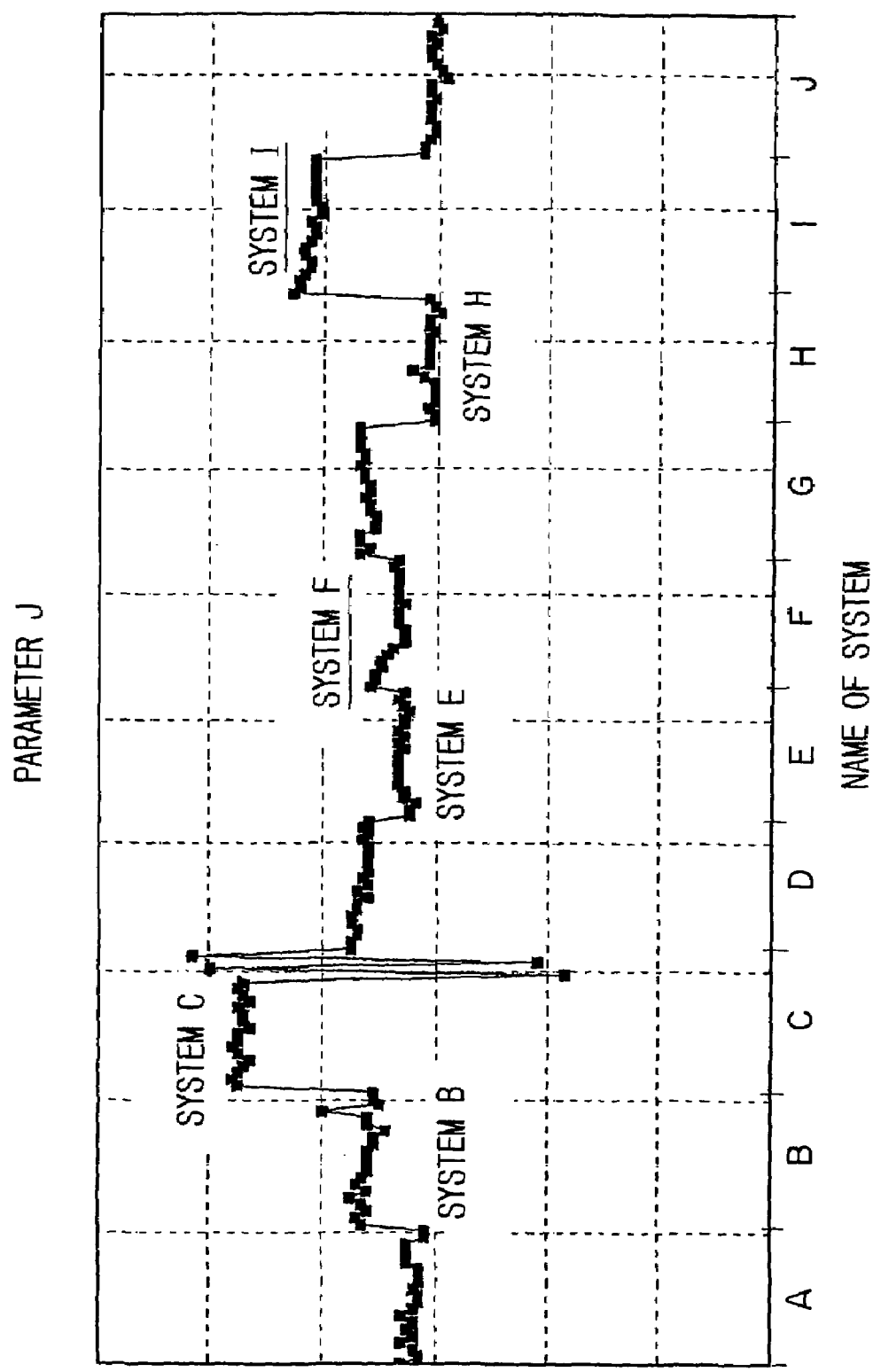
FIG. 14 is a graph corresponding to FIG. 11, which shows another parameter.
Figure 15:
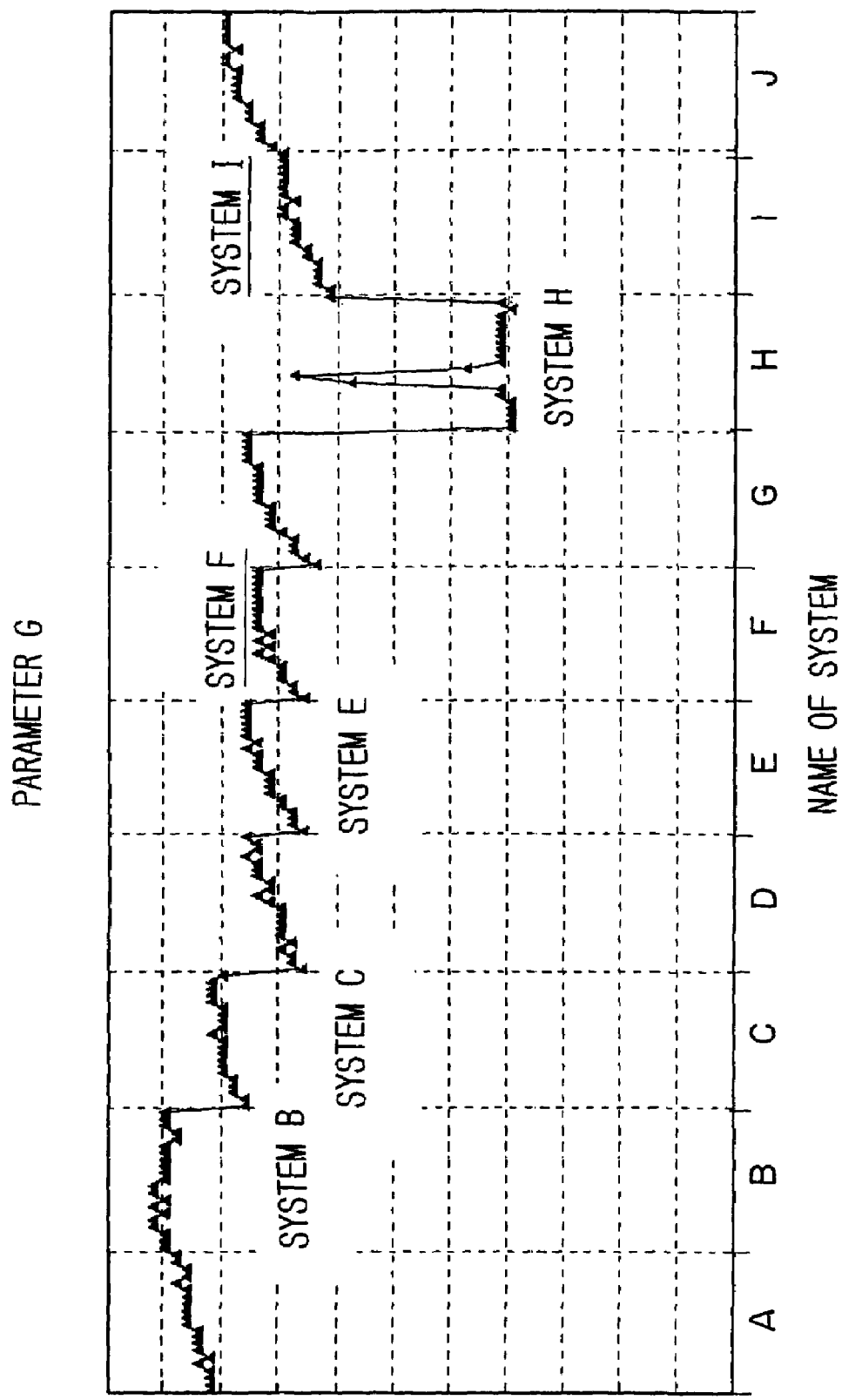
FIG. 15 is a graph corresponding to FIG. 11, which shows another parameter.

According to the results shown in FIG. 9, the residual scores of the processing systems A, D, G and J are hardly different from the residual scores Q of the reference processing systems F and I, whereas the residual scores Q of the processing systems B, C, E and H greatly deviate from the residual scores Q of the reference processing systems. Therefore, it can be seen that the residuals of at least one of parameters of the processing systems B, C, E and H greatly vary from those of the reference processing systems F and I. Therefore, in order to study the parameter having the large residual, FIG. 10 showing residuals of the respective parameters of the processing systems B, C, E and E is viewed. Then, it was found that the residuals of parameters G, H and K are large in the processing system B, the residuals of parameters C, H, J and K are large in the processing system C, the residuals of parameters C and H are large in the processing system E, and the residuals of parameters G, H and J are large in the processing system H. Thus, when the residual score Q of the comparative processing system greatly deviates from the residual scores Q of the reference processing systems F and I, if the residuals of parameters with respect to the respective detectors of the processing system are compared, it is possible to simply identify a detector causing the deviation.

As described above, if only the residual score Q of the comparative processing system is derived to be compared with the residual score $Q_0$ of the reference processing system, it is possible to simply evaluate a comparative processing system having characteristics deviating from those of the reference processing system. The residuals of the respective parameters of the comparative processing system can be found at a glance as shown in FIG. 10. If a specific parameter having a large residual is recognized, it is possible to simply fine that the parameter deviates from that of the reference processing system. Therefore, when the performance of a newly produced processing system or a processing system after maintenance is adjusted, it is possible to simply fine malfunction on performance only by deriving a residual matrix E and its residual score Q of the processing system, and it is possible to identify the specific malfunction, so that it is possible to adjust performance in a short time.

The principal component analysis using the variance-covariance has been described above. Since the detected values of a plurality of detectors have inherent units, respectively, if the respective detected values are used as data for the principal component analysis as they are, there are some cases where it is not possible to carry out evaluation precisely reflecting the operation data. Therefore, in order to precisely evaluate the operation state, excluding the influence of the difference in unit between the respective detected values, all of detected value data are stabilized and a principal component analysis using a correlation matrix is carried out.

In this preferred embodiment, the residual score Q can be used for grasping the difference in characteristics, e.g. the difference in performance, between the processing systems, to evaluate whether the performance of the processing system is relatively good or bad. If the residual component is viewed, it is possible to simply and rapidly identify a portion having lower performance. Therefore, it is possible to simply and rapidly carry out the determination and evaluation of performance of a newly produced processing system or a processing system after maintenance.

Incidentally, in the above described preferred embodiment, the same effects can be obtained if the above described processing conditions are changed into the following processing conditions 1 through 5.

[Processing Conditions 1]
Processing System: Magnetron RIE type Processing System
Wafer: 300 mm
Film to be etched: Silicon Oxide Film
Underlying Layer: Si
Processing Contents: Contact Hole
Bottom Electrode:
  Source High Frequency=13.56 MHz, Source Power: 4000 W
Gap between Electrodes: 40 mm
Processing Pressure: 40 mTorr
Process Gas: $C_4F_8$=20 sccm, CO=100 sccm, Ar=440 sccm, $O_2$=10 sccm
Back Side Gas: He=10 Torr (Central Portion of Electrode), 50 Torr (Edge Portion of Electrode)
Electrostatic Chuck DC Voltage: 2.5 KV
Processing temperature: Top Electrode 60° C., Side Wall=60° C.,
  Bottom Electrode=10° C.

[Processing Conditions 2]
Processing System: Magnetron RIE type Processing System
Wafer: 300 mm
Film to be etched: Silicon Oxide Film
Underlying Layer: SiN
Processing Contents: SAC
Bottom Electrode:
  Source High Frequency=13.56 MHz, Source Power: 4000 W
Gap between Electrodes: 40 mm
Processing Pressure: 40 mTorr
Process Gas: $C_4F_8$=24 sccm, CO=450 sccm, Ar=600 sccm
Back Side Gas: He=10 Torr (Central Portion of Electrode), 50 Torr (Edge Portion of Electrode)
Electrostatic Chuck DC Voltage: 2.5 KV
Processing temperature: Top Electrode 60° C., Side Wall=60° C.,
  Bottom Electrode=10° C.

[Processing Conditions 3]
Processing System: Double Channel Plasma Etching System (Voltage is applied to Both of Top and Bottom Electrodes)
Wafer: 300 mm
Film to be etched: Silicon Oxide Film
Underlying Layer: Si, Metal Film
Processing Contents: Through Hole, Via Contact
Top Electrode:
  Source Frequency=60 MHz, Source Power: 3300 W
Bottom Electrode:
  Source High Frequency=2 MHz, Source Power: 3800 W
Gap between Electrodes: 35 mm
Processing Pressure: 25 mTorr
Process Gas: $C_5F_8$=32 sccm, Ar=750 sccm, $O_2$=45 sccm
Back Side Gas: He=20 Torr (Central Portion of Electrode), 35 Torr (Edge Portion of Electrode)
Electrostatic Chuck DC Voltage: 2.5 KV
Processing Temperature: Top Electrode 60° C., Side Wall=50° C.,
  Bottom Electrode=20° C.

[Processing Conditions 4]
Processing System: Double Channel Plasma Etching System (Voltage is applied to Both of Top and Bottom Electrodes)
Wafer: 300 mm
Film to be etched: Polysilicon
Underlying Layer: Thermal Oxide Film Processing Contents: Gate
Top Electrode:
  Source Frequency=60 MHz, Source Power: 200 W
Bottom Electrode:
  Source High Frequency=13.56 MHz, Source Power: 150 W
Gap between Electrodes: 170 mm
Processing Pressure: 30 mTorr
Process Gas: HBr=400 sccm
Back Side Gas: He=3 Torr (Central Portion of Electrode), 3 Torr (Edge Portion of Electrode)
Electrostatic Chuck DC Voltage: 3.0 KV
Processing temperature: Top Electrode 80° C., Side Wall=60° C.,
  Bottom Electrode=60° C.

[Processing Conditions 5]
Processing System: Double Channel Plasma Etching System (Voltage is applied to Both of Top and Bottom Electrode)
Wafer: 300 mm
Film to be etched: Si
Underlying Layer: –
Processing Contents: ST1
Top Electrode:
  Source Frequency=60 MHz, Source Power: 1800 W
Bottom Electrode:
  Source High Frequency=13.56 MHz, Source Power: 300 W
Gap between Electrodes: 170 mm
Processing Pressure: 100 mTorr
Process Gas: $O_2$=5 sccm, HBr=570 sccm, $Cl_2$=30 sccm,
Back Side Gas: He=3 Torr (Central Portion of Electrode), 3 Torr (Edge Portion of Electrode)
Electrostatic Chuck DC Voltage: 3.0 KV
Processing Temperature: Top Electrode 80° C., Side Wall=60° C.,
  Bottom Electrode=60° C.

Third Preferred Embodiment

A preferred embodiment relating to electrical data of a high frequency source in a processing system will be described below.

Figure 16:
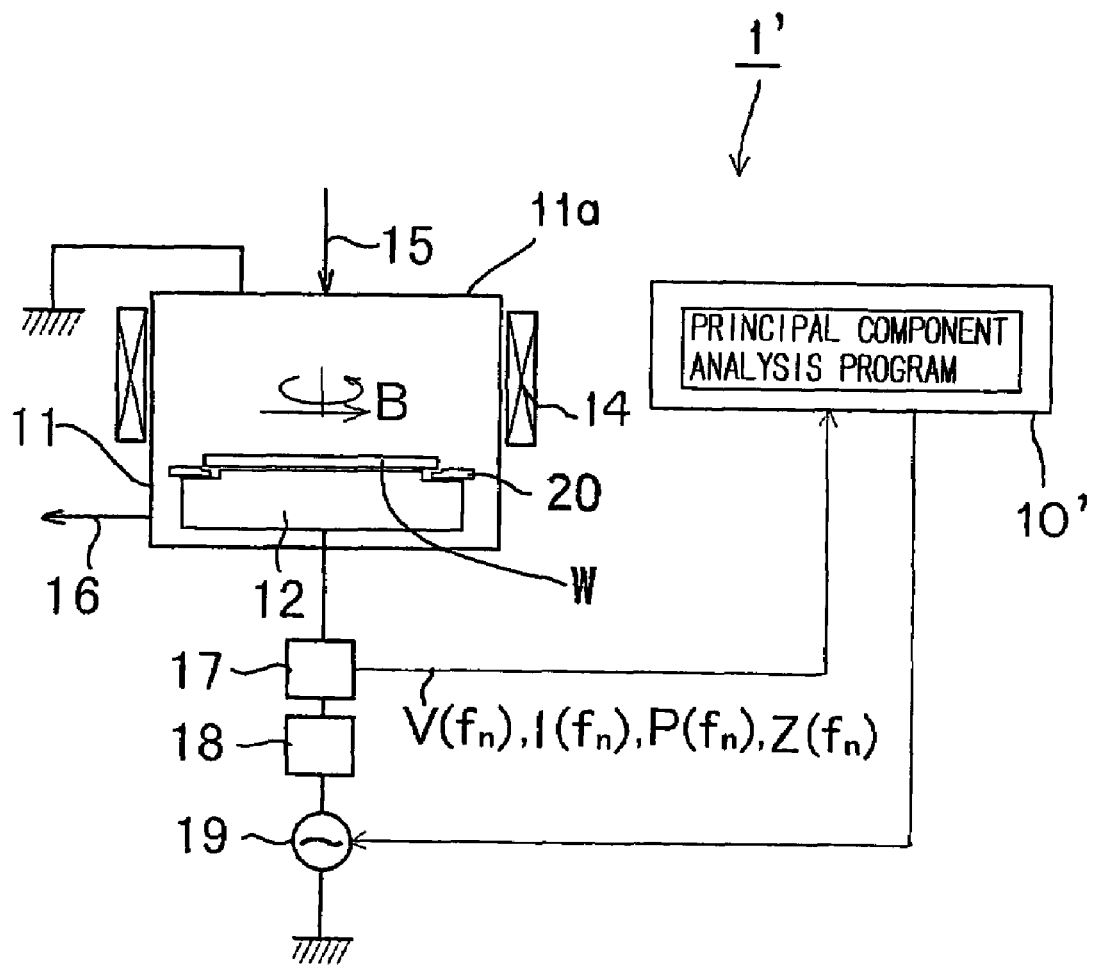
FIG. 16 is a block diagram showing an example of a processing system to which an operation monitoring method and abnormality detecting method according to the present invention are applied.

First, referring to FIG. 16, an example of a processing system to which this preferred embodiment is applied will be described. In a processing system 1' shown in FIG. 16, the same reference numbers are give to components which are substantially the same as those in the processing system 1 shown in FIG. 1, and the detailed descriptions thereof are omitted. The processing system 1' shown in FIG. 16 comprises a processing vessel 11 of a conductive material, such as aluminum. In this processing system 1', the grounded top face 11a of the processing vessel 11 serves as a top electrode facing a bottom electrode 12 also serving as a supporting table. The processing system 1' is designed to form a high density plasma of a process gas fed into the processing vessel 11, by applying a rotating magnetic field B due to a magnetic field forming means 14, to an electric field produced between the top and bottom electrodes 11a and 12 under the control of a control unit 10'. This plasma is intended to carry out a uniform plasma processing, such as a predetermined etching, with respect to a wafer W in the processing vessel 11. On a periphery of the bottom electrode 12, a focus ring 20 is arranged for causing the plasma to converge on the wafer W.

In this preferred embodiment, a matching circuit 18 and a high frequency measuring device 17 are sequentially provided between a high frequency source 19 and the bottom electrode 12. A high frequency power of 13.56 MHz is applied to the bottom electrode 12 from the high frequency source 19. In this case, a higher harmonic wave (e.g. 27.12 MHz, 40.68 MHz) based on a high frequency 13.56 MHz as a fundamental wave is also applied to the electrode 12. However, electrical data, such as the voltage, current, phase and impedance, of the high frequency power applied to the bottom electrode 12 from the high frequency source 19 are unstable immediately after the starting of the system 1', and are not easily stabilized. There is no technique for directly recognizing the state in the processing vessel 1. Therefore, in this preferred embodiment, these electrical data, such as voltage, current, phase and impedance, are measured, and the respective measured values are utilized for detecting the stable condition of the processing system 1', specifically the stable condition required to carry out a predetermined plasma processing in the processing vessel 11.

That is, the high frequency measuring device 17 is used for intermittently measuring voltage, current, phase and impedance as electrical data of a fundamental wave of the high frequency source 19 and its higher harmonic waves until the high frequency source 19 is stabilized after the processing system 1' is started, and these electrical data are sequentially incorporated into the control unit 10'. The control unit 10' stores therein a principal component analysis program as a multivariate analysis program to carry out the principal component analysis of measured values by means of the analysis program to detect the stable condition of the processing system.

For example, when the principal component analysis is carried out in this preferred embodiment, a reference processing system in a state that voltage applied to the electrode 12 from the high frequency source 19 has been stable is used for intermittently measuring voltage V, current I, phase P and impedance Z as reference data, respectively. These data V, I, P and Z are electrical data of the fundamental wave of the high frequency source 19 and its higher harmonic waves. Thus, measured values $V(f_n)$, $I(f_n)$, $P(f_n)$ and $Z(f_z)$ serving as reference data of the respective frequencies $f_n$ are obtained. These measured values are standardized through a centering by subtracting a mean value and a scaling by dividing by a deviation every one of the voltage V and other kinds of values. At this time, the correspondence between the original measured values and standardized measured values has been clarified by arranging them in accordance with, e.g. the sequence of measured values. Then, assuming that the number of various standardized measured values is n and that m measurements are carried out (the number of wafers is m) until stabilized, a matrix including all of standardized measured values as reference data of the reference processing system is expressed by the above described mathematical expression (1).

Then, the control unit 10' derives the mean, maximum, minimum and variance values of all of the stabilized measured values, and a variance-covariance matrix based on these calculated values is used for carrying out a principal component analysis for the stabilized measured values to derive an eigenvalue and its eigenvector.

For example, n standardized measured values are taken in each of m measurements, and the j-th principal component corresponding to the j-th eigenvalue of the i-th measurement is expressed by the above described mathematical expression (2). Then, a value obtained by substituting the concrete i-th stabilized detected values $(x_{i1}, x_{i2}, \ldots, x_{in})$ for the j-th principal component $t_{ij}$ is a score of the j-th principal component in the i-th measurement. Therefore, the score $t_j$ of the j-th principal component is defined by the above described mathematical expression (3), and the eigenvector $P_j$ of the j-th principal component is defined by the above described mathematical expression (4). The $t_j$ is a score denoting the relationship between measured values, and $P_j$ is an eigenvector denoting weights between measured values. Using a matrix X and the eigenvector $P_j$, the score $t_j$ of the j-th principal component is expressed by the above described mathematical expression (5). Using the scores of principal components and their eigenvectors, the matrix X is expressed by the above described mathematical expression (6):

Therefore, even if various kinds of measured data exist, the principal component analysis can integrate them into a small number of statistical data of, e.g. the first and second principal components and the third principal component at most, and evaluate and grasp an operation state only by examining the small number of statistical data. As described above, if the cumulative contribution of the eigenvalues of the first and second principal components exceeds 90%, the reliability of evaluation based on the first and second principal components is generally high. The first principal component denotes a direction in which measured data are most greatly distributed (varied) as described above, to be an index for comprehensively evaluating the operation state of the processing system, to be suitable for the decision and evaluation of the variation of the operation state of the processing system with time. The second principal component is distributed in a direction perpendicular to the first principal component, to be an index of an instantaneous shift from a normal operation state, to be suitable for the decision and evaluation of the sudden variation in operation state.

If the eigenvector, the first principal component scores and so forth are viewed, the first principal component can comprehensively evaluate which tendency exists in data. However, since the eigenvectors in the first and second principal components are univocally determined, it is not possible to multilaterally grasp the state and variation of the individual measured data every measurement.

Therefore, in this preferred embodiment, as a technique for detecting that the power application state of the high frequency power 19 reaches a stable condition in accordance with the state in the processing vessel 11, a residual matrix E defined by the above described mathematical expression (7) integrating the lower contribution principal components of order higher than (k+1) is prepared (the components of each row correspond to the respective standardized measured values of the fundamental wave and its higher harmonic waves, and the components of each column correspond to the numbers of measurements). Then, this residual matrix E is adapted to the above described mathematical expression (6), the mathematical expression is expressed by the above described mathematical expression (8). In addition, the residual score of the residual matrix E of the reference processing system is derived as a reference residual score $Q_0$. Then, on the basis of the residual score $Q_0$, comparing with the reference processing system, it is detected whether the state of a comparative processing system to be monitored reaches a stable condition after the system is started.

In general, the residual score $Q_i$ is expressed as the product of a row vector $e_i$ and its transposed vector $e_i^T$, and is the sum of squares of the respective residual components so as to be capable of being surely derived as a residual without setting plus components off against minus components. Therefore, if the residual score $Q_0$ of the reference processing system every measurement is compared with the residual score $Q_i$ of the comparative processing system, it is possible to determine whether the state of the comparative processing system reaches a stable condition. Then, when the residual score $Q_i$ of the comparative processing system at a certain time deviates from the residual score $Q_0$ of the reference processing system at that time, if the components of each row vector $e_i$ of each row expressed by the above described mathematical expression (9) in the residual matrix E are viewed, it is possible to determine which measured value has a great deviation at that time, so that it is possible to identify the cause of abnormality.

That is, in order to detect the stable condition of the comparative processing system, the residual score $Q_0$ of the residual matrix E of the reference processing system is first derived. Then, constants, such as the residual score $Q_0$ and eigenvector obtained by the reference processing system, are set in the principal component analysis program for the comparative processing system, and the residual score Q is derived from electrical data measured in the comparative processing system on the set conditions. Then, the difference (deviation) between the residual score Q of the comparative processing system and the residual score $Q_0$ of the reference processing system is derived, and on the basis of the difference $(Q-Q_0)$ in residual score, it is determined whether the power application state of the high frequency source 19 in the comparative processing system reaches a stable condition. That is, if the difference $(Q-Q_0)$ in residual score is large, it shows that the comparative processing system greatly deviates from the reference processing system to be unstable, and if the difference $(Q-Q_0)$ is small, it shows that the deviation of the comparative processing system from the reference processing system is small so that the state of the comparative processing system is close to a stable condition. If the residual score of the reference processing system is set so that $Q_0=0$, the residual score Q itself of the comparative processing system is the quantity of deviation from the reference level. It is assumed that the values of variables are calculated so that the mean value is 0.

On the basis of a method for monitoring an operation of a processing system according to the present invention, the following states A, B and processing conditions A, B were optionally combined to actually process wafers. The standardized measured values and residual scores Q of measured values $V(f_n)$, $I(f_n)$, $P(f_n)$ and $Z(f_n)$ of fundamental waves and their higher harmonic waves during the processing are shown in FIGS. 17a through 20. In the principal component program of the comparative processing system, the results of principal component analysis obtained by the reference processing system are preset. Plots in the respective figures denote mean values per wafer. It is assumed that, with respect to the values of deposition in the following processing conditions, a value on conditions that the quantity of deposition is small is 1, and conditions that the quantity of deposition is large are shown by relative values with respect to the conditions that the quantity of deposition is small.

I. State

State A: State that Processing Vessel has been evacuated for 12 Hours

State B: State that Processing Vessel has been evacuated for 4 days

II. Processing Conditions

Processing Condition A (Condition that the quantity of deposition is small)
Wafer Processing Time: 1 minute
High Frequency Power: 1700 W
Processing Vessel Pressure: 45 mTorr Process Gases: $C_4F_8$=10 sccm, CO=50 sccm,
  Ar=200 sccm, $O_2$=5 sccm
Deposition: 1 (Relative Value)
Processing Condition B (Condition that the quantity of deposition is large)
  Wafer Processing Time: 1 minute
  High Frequency Power: 1500 W
  Processing Vessel Pressure: 53 mTorr
  Process Gases: $C_4F_8$=16 sccm, CO=300 sccm,
   Ar=400 sccm
  Deposition: 1.95 (Relative Value)

First, referring to FIGS. 17a through 18b, the difference in stabilization due to the difference in processing condition after maintenance will be described below.

Figure 17A:
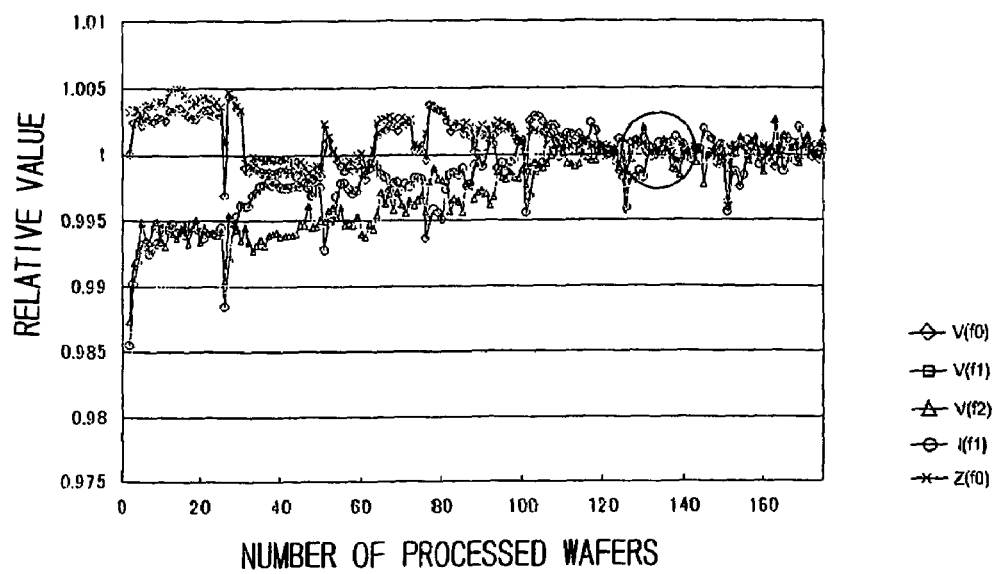
FIGS. 17a and 17b are graphs showing transition until electrical data of a processing system are stabilized by means of a high frequency measuring device, respectively.
Figure 18A:
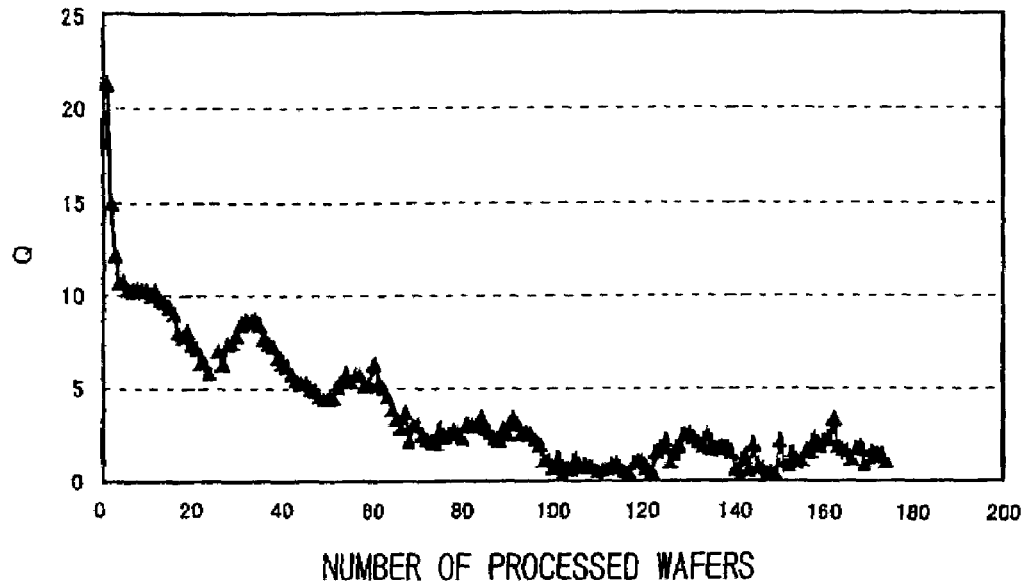
FIGS. 18a and 18b are graphs showing transition until residual scores of electrical data corresponding to FIGS. 17a and 17b are stabilized, respectively.

(1) State A+Processing Condition A (FIGS. 17a and 18a)

After the state in the processing vessel 11 was lead to state A, the processing system was set to be in the processing condition A that the quantity of deposition was small. In this combination of the state and the condition, wafers W carried in the processing vessel 11 were processed. Immediately after the wafers were carried therein (immediately after the starting), the voltages, currents, phases and impedances of the fundamental and higher harmonic waves were measured every about 0.2 seconds by means of the high frequency measuring device 17, and the mean values of the respective measured values $V(f_n)$, $I(f_n)$, $P(f_n)$ and $Z(f_n)$ were derived every wafer. These mean values were converted into relative values with respect to the corresponding values (reference values) of the reference processing system, and the variations thereof were shown in FIG. 17a.

Figure 23A:
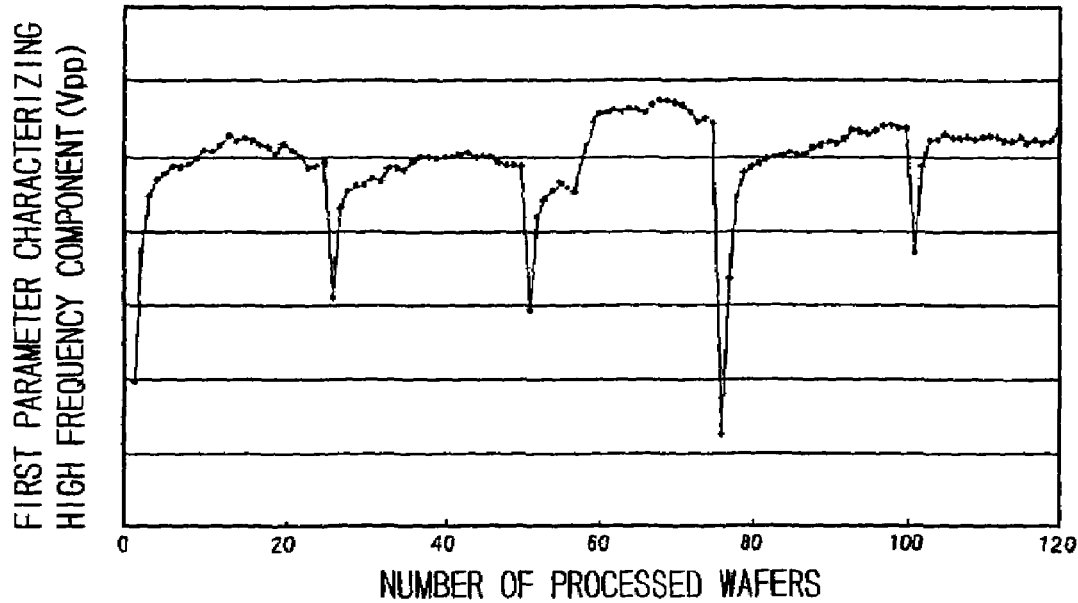
FIGS. 23a and 23b are graphs showing the conventional variation in electrical data immediately after a processing system is started, respectively.
Figure 23B:
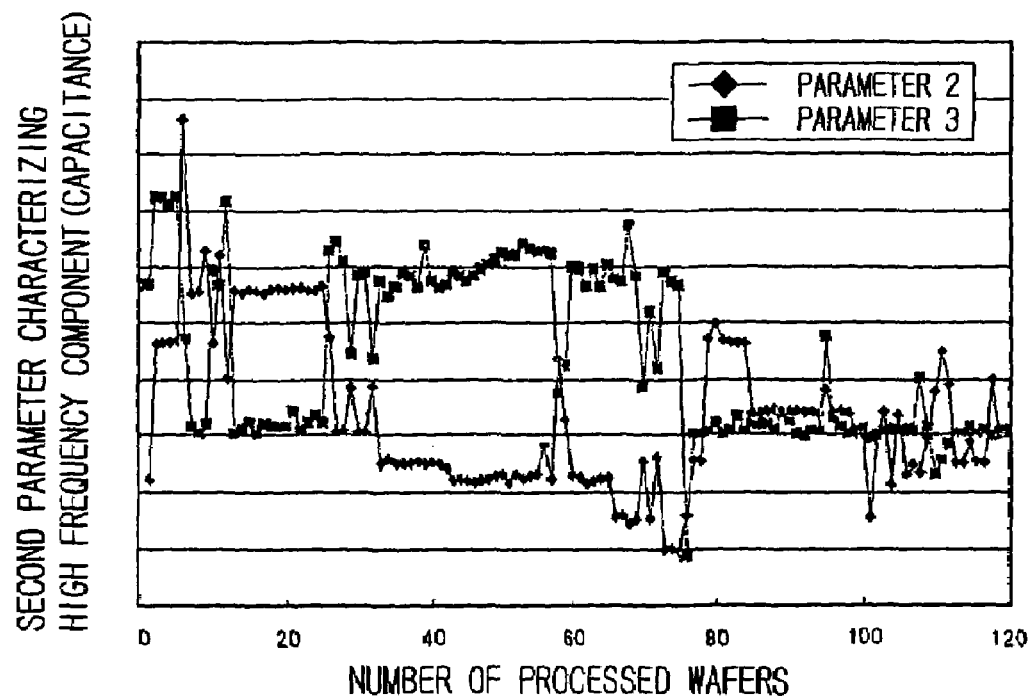

According to the results shown in FIG. 17a, it can be seen that the respective measured values are gradually converging on the reference values (=1) immediately after the starting of processing, and reach the reference value levels in a region shown by ○ in the figure to be in a stable condition. However, the fluctuation in vertical directions is acknowledged after ○. Also in the case shown in FIG. 17a, the determination of stable condition is easier than the conventional method shown in FIGS. 23a and 23b. On the other hand, the results of the residual scores Q derived from the measured values by the method in this preferred embodiment were shown in FIG. 18a. In FIG. 18a, the measured values are integrated into one as the residual score Q, and the determination of deviation from the reference values is easier than that in FIG. 17a, so that it can be determined that the stable condition is in the range of 100 to 120 processed wafers. Thereafter, it can be seen that there is a tendency for the residual score Q to periodically slightly increase.

Figure 17B:
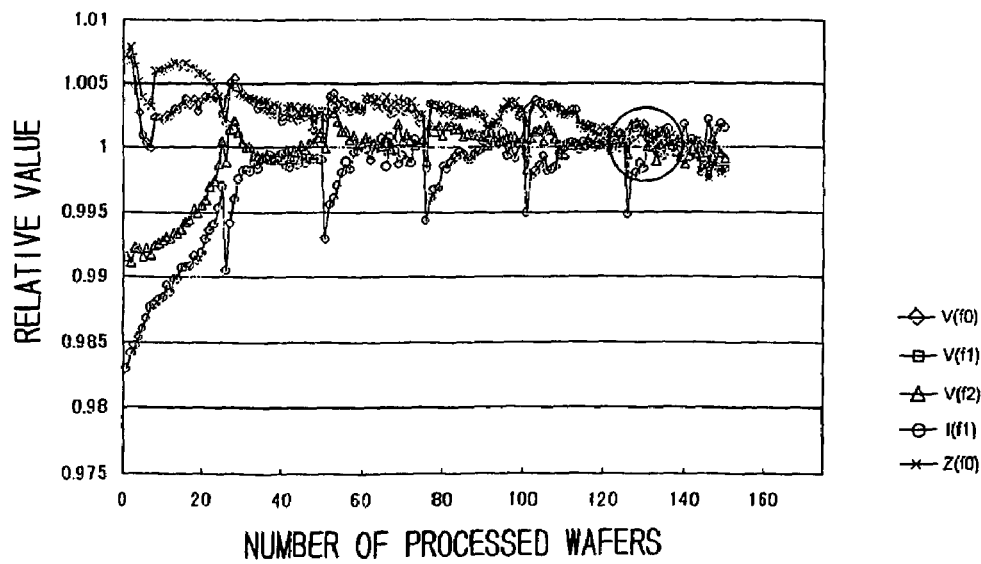
Figure 18B:
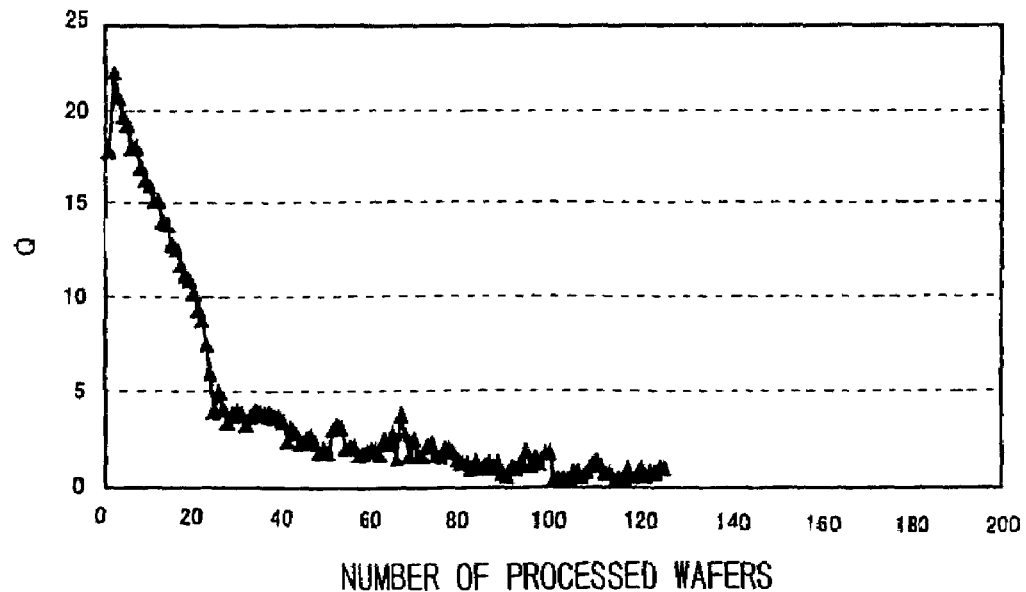

(2) State A+Processing Condition B (FIGS. 17b and 18b)

After the state in the processing vessel 11 was lead to state A similar to (1), the processing system was set to be in the processing condition B that the quantity of deposition was large unlike (1). Then, wafers W carried in the processing vessel 11 were processed. Measured values were obtained immediately after the processing system was started until the power application state of the high frequency power 19 was stabilized. Thereafter, the relative values of the respective measured values with respect to the reference values were derived similar to the case of (1), and the results thereof were shown in FIG. 17b. According to the results shown in FIG. 17b, although the respective measured values more early approach a stable condition than the case of (1), the region in which the respective measured values reach a stable condition having a small amplitude is a region shown by ○ to be substantially the same as the case of (1). On the other hand, if the residual scores Q are derived by the method in this preferred embodiment, it can be seen from FIG. 18b that the residual scores Q more early converge on the reference values than the case of (1) to reach the stable condition, so that it is easy to determine the timing of reaching the stable condition. If the residual scores as the standard for determining the stable condition are previously determined by using the reference processing system, it is possible to surely determine the stable condition of the comparative processing system.

Figure 19A:
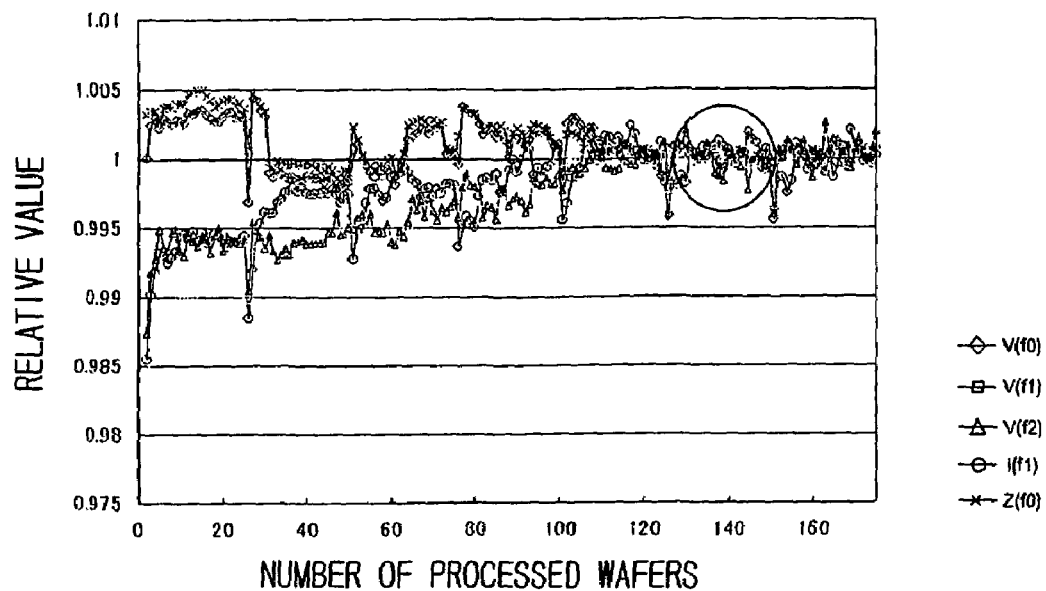
FIGS. 19a and 19b are graphs showing transition until electrical data of a processing system are stabilized by means of a high frequency measuring device, respectively.
Figure 19B:
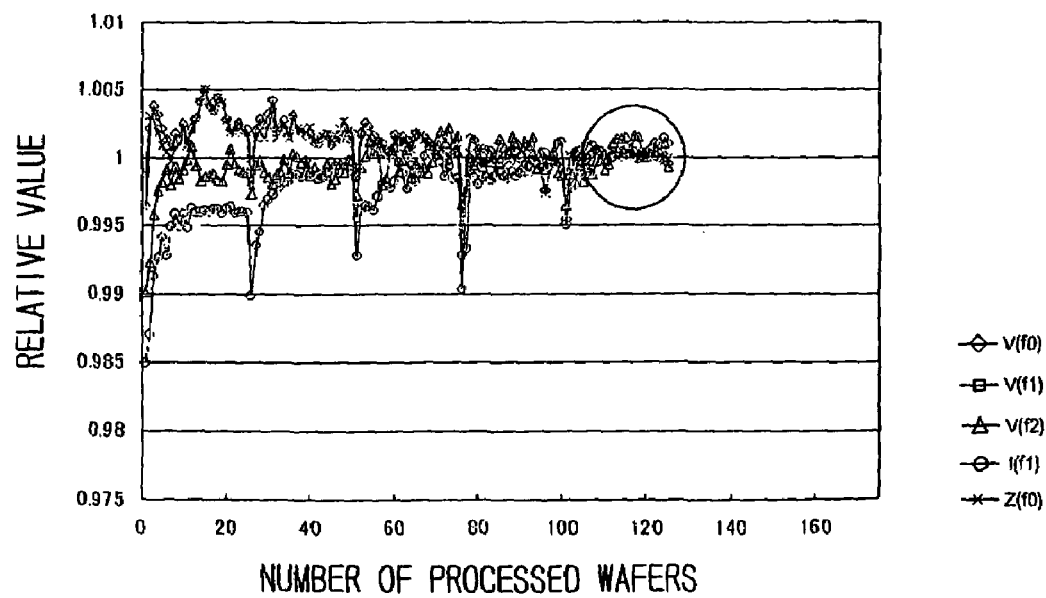
Figure 20:
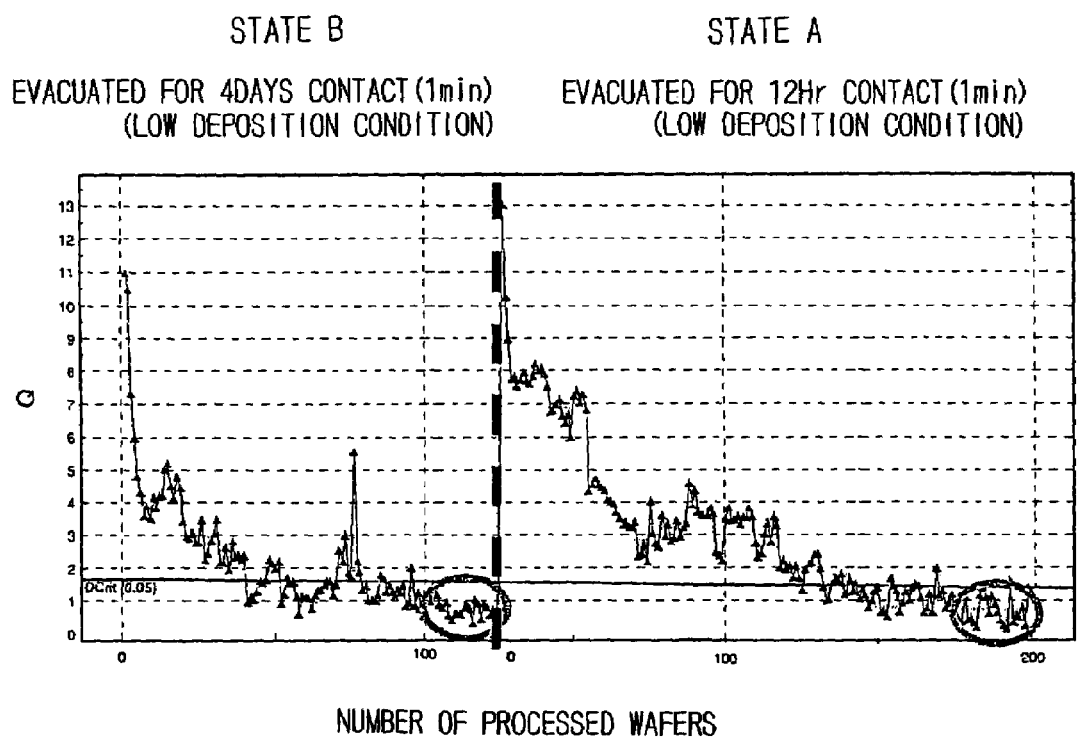
FIG. 20 is a graph showing transitions until residual scores of electrical data corresponding to FIGS. 17a and 17b are stabilized, by states A and B, respectively.

Referring to FIGS. 19a, 19b and 20, the difference in stabilization due to the difference in state in the processing vessel after maintenance will be described below.

(3) State A+Processing Condition A (FIGS. 19a and 20)

After the state in the processing vessel 11 was lead to state A, the processing system was set to be in the processing condition A that the quantity of deposition was small. Then, wafers W carried in the processing vessel 11 were processed. After measured values were obtained immediately after the processing system was started until the power application state of the high frequency power 19 was stabilized. Thereafter, the relative values of the respective measured values with respect to the reference values were derived similar to the case of (1), and the results thereof were shown in FIG. 19a. It can be seen from the results shown in FIG. 19a that the respective measured values gradually converge on the reference values and slowly reach the stable condition. It can be determined that the measured values reach the stable condition in a region shown by ○ in which about 120 wafers were processed. However, thereafter, the measured values fluctuate in vertical directions, so that it can be seen that it is difficult to determine stabilization. On the other hand, if residual scores Q were derived by the method in this preferred embodiment, the state A shown in FIG. 20 was obtained. It can be clearly seen from the results of the state A shown in FIG. 20 that it unexpectedly takes a lot of time until the residual score Q converges on the reference value unlike the results shown in FIG. 18a and is first in a stable condition in the vicinity of the region ○ in which about 180 wafers are processed.

(4) State B+Processing Condition A (FIGS. 19b and 20)

After the state in the processing vessel 11 was lead to state B, the processing system was set to be in the processing condition A that the quantity of deposition was small, similar to the case of (3). Then, wafers W carried in the processing vessel 11 were processed. After measured values were obtained immediately after the processing system was started until the power application state of the high frequency power 19 was stabilized. Thereafter, the relative values of the respective measured values with respect to the reference values were derived similar to the case of (1), and the results thereof were shown in FIG. 19b. It can be seen from the results shown in FIG. 19b that the respective measured values more early converge on the reference values than the case of (3) and early reach the stable condition. In addition, residual scores Q were derived by the method in this preferred embodiment, the state B shown in FIG. 20 was obtained. It can be clearly seen from the results of the state B shown in FIG. 20 that, although the residual score Q early reaches the reference value, it fluctuates before 100 wafers are processed, so that it is completely stabilized after 100 wafers are processed.

As described above, according to this preferred embodiment, the measured values $V(f_n)$, $I(f_n)$, $P(f_n)$ and $Z(f_n)$ of electrical data, voltage, current, phase and impedance, of the fundamental and higher harmonic waves of the stabilized processing system 1' are used for previously carrying out a principal component analysis as a reference to derive a reference residual score $Q_0$. Thereafter, electrical data are measured by the high frequency measuring device 17 immediately after the comparative processing system 1', which has been provided with maintenance and inspected, is started, and measured values $V(f_n)$, $I(f_n)$, $P(f_n)$ and $Z(f_n)$ are used for carrying out a principal component analysis to derive a residual score Q for comparison. Then, the residual score Q for comparison is compared with the residual score $Q_0$ for reference to detect the stable condition of the high frequency source 19 in the comparative processing system 1' after maintenance on the basis of the difference $(Q-Q_0)$. Therefore, even if vast numbers of measured values exist, if only the residual score Q obtained by integrating these data is compared with the reference value, the comparative processing system 1', which has been provided with maintenance and inspected, specifically the stable condition in the processing vessel 11 thereof, can be objectively and surely evaluated and determined. According to this preferred embodiment, it is not only possible to evaluate and determine the timing of reaching the stable condition, but it is also possible to evaluate and determine how to set processing conditions, such as the time to evaluate the processing vessel 11, to lead the state in the processing vessel 11 to the stable condition.

Fourth Preferred Embodiment

A preferred embodiment of a method for detecting the abnormality of a processing system will be described below.

The method for detecting the abnormality of the processing system in this preferred embodiment is in common with the operation monitoring method in the above described third preferred embodiment at the point that the residual score Q in the principal component analysis is used. However, in this preferred embodiment, a normal processing system, i.e. a processing system which has no mounting errors for parts in the processing vessel 11 or high frequency source 19 and which is precisely assembled in accordance with the design specification, is used as a reference processing system. In this preferred embodiment, electrical data of the fundamental wave and its higher harmonic waves are, of course, measured at the stage that the power application state of the high frequency source 19 after the starting of the processing system escapes from an unstable condition to reach a stable condition.

Therefore, also in this preferred embodiment similar to the above described preferred embodiment, the voltage, current, phase and impedance of the fundamental wave and its higher harmonic waves with respect to the reference processing system are intermittently measured to obtain measured values $V(f_n)$, $I(f_n)$, $P(f_n)$ and $Z(f_n)$ of the respective frequencies to standardize these measured values. Then, a residual score $Q_0$ defined by the above described mathematical expression (9) is previously derived with respect to the reference processing system. Constants, such as an eigenvector, obtained by the reference processing system are set in the principal component analysis program of the comparative processing system, and a residual score Q is derived from the electrical data of the comparative processing system on the set conditions. Then,the difference (deviation) between the residual score $Q_0$ of the reference processing system and the residual score Q of the comparative processing system is obtained, and on the basis of the difference $(Q-Q_0)$ in residual score, it is determined whether the comparative processing system is abnormal.

That is, if the difference $(Q-Q_0)$ in residual score is large, it means that the comparative processing system has abnormality, such as mounting errors for parts of the processing vessel 11 or high frequency source 19. On the other hand, if the difference $(Q-Q_0)$ is below an allowable value, it is determined that the processing system is normal. If a certain residual score indicates a value different from another residual score, residual components of a row having the different value are noticed in the residual matrix E. For example, when the residual score in the results of the i-th measurement is different from the reference residual score $Q_0$, if the residual component $e_{ij}$ of $e_i$ of the i-th row is viewed, it can be determined which variable (measured value) contributes to the deviation of the residual score Q. Thus, it is possible to classify causes of abnormality by associating the causes of abnormality with variables (voltage, current etc. of fundamental and higher harmonic waves) having a large residual.

Figure 21:
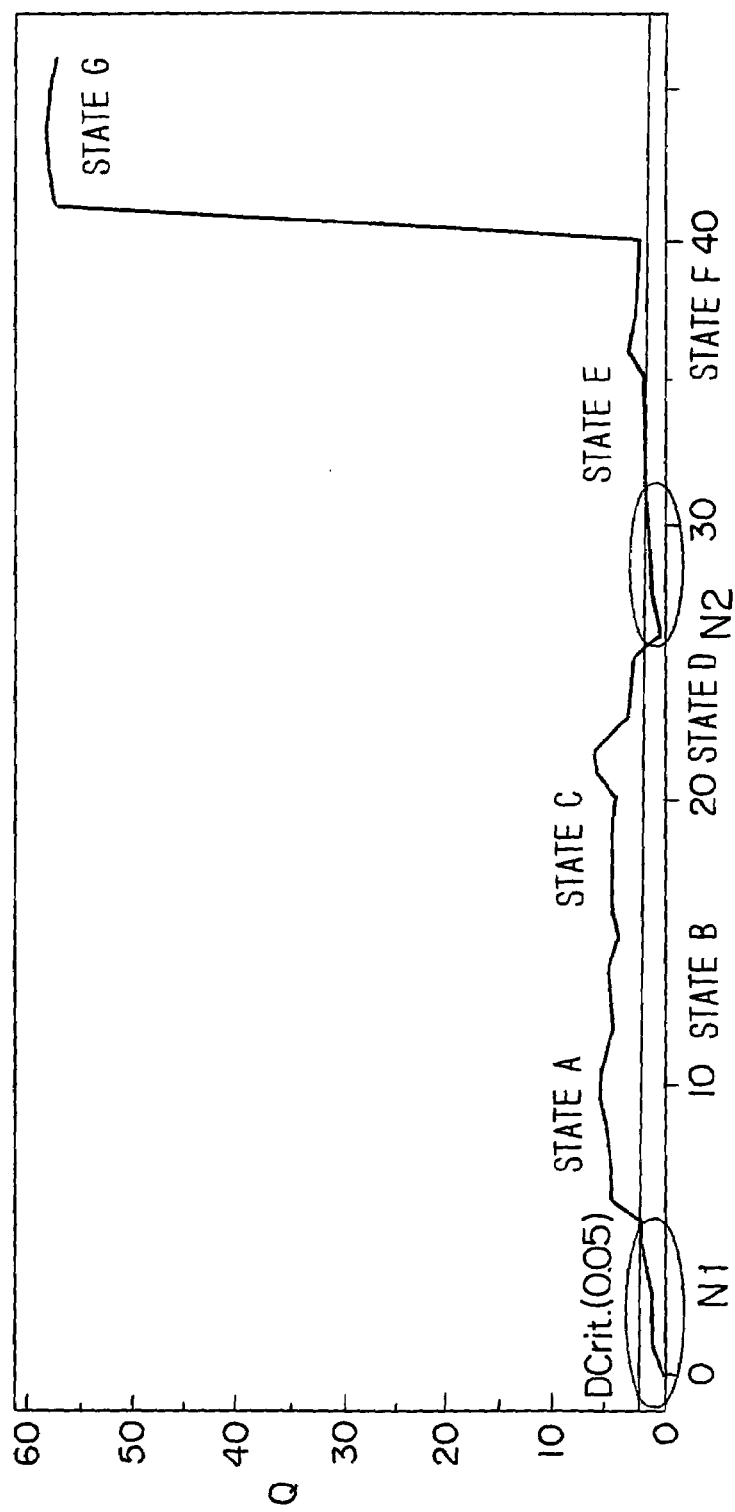
FIG. 21 is a graph showing residual scores based on electrical data of normal and abnormal processing systems.

FIG. 21 is a graph concretely showing the relationship between residual scores Q and part-mounting errors. In FIG. 21, N1 and N2 denote residual scores of a normal processing system, state A denoting residual scores when a specific portion, state C denoting residual scores when missing a screw and a cover in a specific portion, state D denoting residual scores when missing a screw in a portion different from state A, state E denoting residual scores when missing a screw and a cover in a portion different from State C, state F denoting residual scores when a screw of a specific portion is loosened, and state G denoting residual scores when missing a specific part.

Figure 22A:
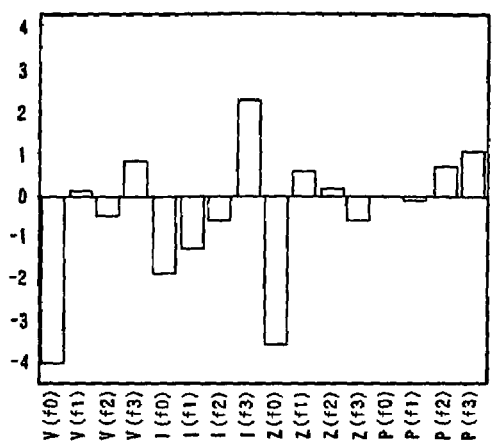
FIGS. 22a, 22b and 22c are graphs showing residual components of electrical data of abnormal processing systems, respectively.
Figure 22B:
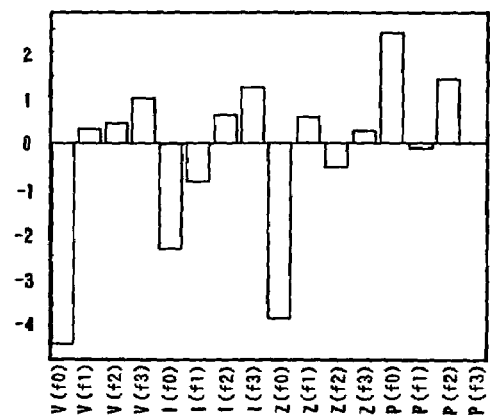
Figure 22C:
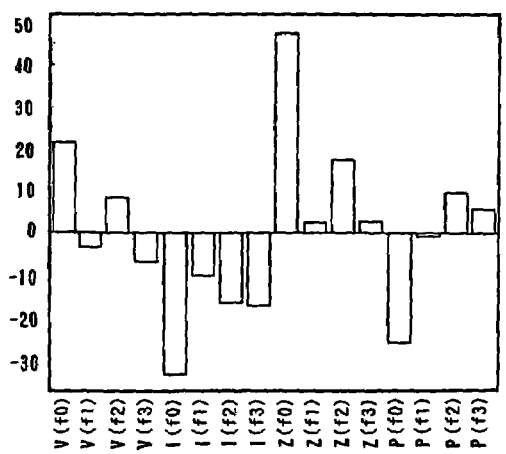

For example, with respect to the residual components of a row showing the residual scores in the state A of FIG. 21, it can be seen from FIG. 22a that the voltage V and impedance Z of the fundamental wave ($f_0$) particularly greatly deflect to the minus side and that the current I of the third harmonic wave ($f_3$) particularly greatly deflects to the plus side. With respect to the state C in FIG. 21, it can be seen from FIG. 22b that the voltage V and impedance Z of the fundamental wave particularly greatly deflect to the minus side and that the phase P of the fundamental wave relatively greatly deflects to the plus side. With respect to the state G in FIG. 21, it can be seen from FIG. 22c that the current I and phase P of the fundamental wave deflect to the minus side and that the impedance Z of the fundamental wave particularly greatly deflects to the plus side. Thus, it is possible to classify the relationship between the specific states (kinds and mounting portion of related parts) and so forth causing abnormality, and components having large residual scores. Therefore, by recognizing components having high contributions to the residual scores by previously grasping this relationship, it is possible to determine which abnormality exists.

As described above, according to this preferred embodiment, measured data of the high frequency source 19 of a normal reference processing system are previously used for carrying out a principal component analysis to derive a residual score for reference. Then, a plurality of measured data obtained by measuring a plurality of electrical data of a comparative processing system are used for carrying out a principal component analysis to derive a residual score for reference. Then, the comparative residual score Q is compared with the reference residual score $Q_0$, so that the abnormality of the comparative processing system can be detected from the difference $(Q-Q_0)$. Thus, it is possible to surely detect the abnormality-due to part-mounting errors and so forth without opening the processing system. It is also possible to distinguish or classify the abnormalities, such as part mounting errors, from the components of the residual matrix E in the processing system.

While the principal component analysis has been used as a multivariate analysis in the above described preferred embodiments, the present invention can be realized by using another multivariate analysis, such as regression analysis. While the plasma processing system for etching a semiconductor wafer has been described as an example, the present invention can be applied to another semiconductor producing system or another general processing system.

The invention claimed is:

1. An operation monitoring method for monitoring an operation of a processing system by utilizing a plurality of detected values as operation data, the detected values being detected for every object to be processed by means of a plurality of detectors provided in the processing system, the method comprising the steps of:
    obtaining previously a plurality of operation data with respect to a plurality of objects to be processed as references;
    carrying out a principal component analysis using the operation data;
    dividing the operation data into relatively high contribution principal components and low contribution principal components;
    deriving a residual matrix of operation data belonging to the low contribution principal components; and
    evaluating an operation state of the processing system on the basis of a first and a second principal component score and a residual score obtained by the residual matrix.

2. An operation monitoring method as set forth in claim 1, wherein a variance value of the first principal component score is used for determining a timing of stopping the operation.

3. An operation monitoring method as set forth in claim 1, wherein the residual matrix is derived from a higher-order principal component than the second principal component.

4. A processing system evaluating method for evaluating a difference in characteristics between a plurality of processing systems by utilizing a plurality of detected values as operation data, the detected values being detected for every object to be processed by means of a plurality of detectors provided in the processing systems, the method comprising the steps of:
    obtaining first operation data for each of the objects to be processed by using a reference processing system;
    carrying out a principal component analysis using the first operation data to derive a first residual matrix;
    obtaining second operation data for each of the objects to be processed by using a comparative processing system to be compared with the reference processing system;
    applying the second operation data to results of the principal component analysis to derive a second residual matrix; and
    comparing the first residual matrix based on the first operation data with the second residual matrix based on the second operation data to evaluate a difference in performance between the processing systems.

5. A processing system evaluating method as set forth in claim 4, wherein the comparison of the first and second residual matrixes with each other is carried out by using residual scores.

6. A processing system monitoring method for measuring a plurality of electrical data of a high frequency source varying in accordance with a state in a processing system, by means of a measuring device, when a high frequency power is applied to an electrode in a processing vessel from the high frequency source for processing an object with plasma in the processing system, and for carrying out a multivariate analysis using the measured electrical data to detect a power application state of the high frequency source, the method comprising the steps of:
    measuring the electrical data as reference data when the power application state of the high frequency source is stabilized in accordance with the state in the processing vessel in a reference processing system;
    carrying out a multivariate analysis for reference using the obtained reference data;
    measuring successively the electrical data as comparative data in a comparative processing system to be monitored, after the system is started;
    carrying out a multivariate analysis for comparison using the obtained comparative data and
    comparing results of the multivariate analysis for comparison with a result of the multivariate analysis for reference to determine, on the basis of a difference therebetween, whether the power application state of the high frequency source in the comparative processing system reaches a stable condition in accordance with the state in the processing vessel.

7. An operation monitoring method as set forth in claim 6, wherein at least voltage, current, impedance and phase angle of a fundamental wave and higher harmonic waves are used as the electrical data.

8. An operation monitoring method as set forth in claim 6, wherein the multivariate analysis is a principal component analysis.

9. An operation monitoring method as set forth in claim 8, wherein a residual score is used as the result of the principal component analysis.

10. An operation monitoring method as set forth in claim 9, wherein processing conditions and/or operating conditions in the processing system are determined on the basis of a result of comparison of the residual scores with each other.

11. An abnormality detecting method for detecting an abnormality of a processing system by measuring a plurality of electrical data of a high frequency source varying in accordance with a state in the processing system, by means of a measuring device, when a high frequency power is applied to an electrode in a processing vessel from the high frequency source for processing an object with plasma in the processing system, and by carrying out a multivariate analysis using the measured electrical data to detect a power application state of the high frequency source, the method comprising the steps of:
    measuring the electrical data as reference data when the power application state of the high frequency source is stabilized in accordance with the state in the processing vessel in a normal reference processing system;
    carrying out a multivariate analysis for reference using the obtained reference data;
    measuring the electrical data as comparative data in a comparative processing system, the abnormality of which is to be detected;
    carrying out a multivariate analysis for comparison using the obtained comparative data; and
    comparing a result of the multivariate analysis for comparison with a result of the multivariate analysis for reference to detect the abnormality of the comparative processing system on the basis of a difference therebetween.

12. An abnormality detecting method as set forth in claim 11, wherein at least voltage, current, impedance and phase angle of a fundamental wave and higher harmonic waves are used as the electrical data.

13. An abnormality detecting method as set forth in claim 11, wherein the multivariate analysis is a principal component analysis.

14. An abnormality detecting method as set forth in claim 13, wherein a residual score is used as the result of the principal component analysis.

15. An abnormality detecting method as set forth in claim 13, wherein a cause of abnormality of the processing system is distinguished on the basis of components of a residual matrix obtained by the principal component analysis.

16. A processing system control unit for monitoring an operation of a processing system by utilizing a plurality of detected values as operation data, the detected values being detected for every object to be processed by means of a plurality of detectors provided in the processing system, the control unit executing a procedure comprising the steps of:
    obtaining previously a plurality of operation data with respect to a plurality of objects to be processed as references;
    carrying out a principal component analysis using the operation data;
    dividing the operation data into relatively high contribution principal components and low contribution principal components;
    deriving a residual matrix of operation data belonging to the low contribution principal components; and
    evaluating an operation state of the processing system on the basis of a first and a second principal component score and a residual score obtained by the residual matrix.

17. A processing system control unit as set forth in claim 16, wherein a variance value of the first principal component score is used for determining a timing of stopping the operation.

18. A processing system control unit as set forth in claim 16, wherein the residual matrix is derived from a higher-order principal component than the second principal component.

19. A processing system control unit for evaluating a difference in characteristics between a plurality of processing systems by utilizing a plurality of detected values as operation data, the detected values being detected for every object to be processed by means of a plurality of detectors provided in the processing systems, the control unit executing a procedure comprising the steps of:
    obtaining first operation data for each of the objects to be processed by using a reference processing system;
    carrying out a principal component analysis using the first operation data to derive a first residual matrix;
    obtaining second operation data for each of the objects to be processed by using a comparative processing system to be compared with the reference processing system;
    applying the second operation data to results of the principal component analysis to derive a second residual matrix; and
    comparing the first residual matrix based on the first operation data with the second residual matrix based on the second operation data to evaluate a difference in performance between the processing systems.

20. A processing system control unit as set forth in claim 19, wherein the comparison of the first and second residual matrixes with each other is carried out by using residual scores.

21. A processing system control unit for measuring a plurality of electrical data of a high frequency source varying in accordance with a state in a processing system, by means of a measuring devise, when a high frequency power is applied to an electrode in a processing vessel from the high frequency source for processing an object with plasma in the processing system, and for carrying out a multivariate analysis using the measured electrical data to detect a power application state of the high frequency source, the control unit executing a procedure comprising the steps of:
    measuring the electrical data as reference data when the power application state of the high frequency source is stabilized in accordance with the state in the processing vessel in a reference processing system;
    carrying out a multivariate analysis for reference using the obtained reference data;
    measuring successively the electrical data as comparative data in a comparative processing system to be monitored, after the system is started;
    carrying out a multivariate analysis for the comparison using the obtained comparative data; and
    comparing results of the multivariate analysis for comparison with a result of the multivariate analysis for reference to determine, on the basis of a difference therebetween, whether the power application state of the high frequency source in the comparative processing system reaches a stable condition in accordance with the state in the processing vessel.

22. A processing system control unit as set forth in claim 21, wherein at least voltage, current, impedance and phase angle of a fundamental wave and higher harmonic waves are used as the electrical data.

23. A processing system control unit as set forth in claim 21, wherein the multivariate analysis is a principal component analysis.

24. A processing system control unit as set forth in claim 23, wherein a residual score is used as the result of the principal component analysis.

25. A processing system control unit as set forth in claim 24, wherein processing conditions and/or operating conditions in the processing system are determined on the basis of a result of comparison of the residual scores with each other.

26. A processing system control unit for detecting an abnormality of a processing system by measuring a plurality of electrical data of a high frequency source varying in accordance with a state in the processing system, by means of a measuring device, when a high frequency power is applied to an electrode in a processing vessel from the high frequency source for processing an object with plasma in the processing system, and by carrying out a multivariate analysis using the measured electrical data to detect a power application state of the high frequency source, the control unit executing a procedure comprising the steps of:
    measuring the electrical data as reference data when the power application state of the high frequency source is stabilized in accordance with the state in the processing vessel in a normal reference processing system;
    carrying out a multivariate analysis for reference using the obtained reference data;
    measuring the electrical data as comparative data in a comparative processing system, the abnormality of which is to be detected;
    carrying out a multivariate analysis for comparison using the obtained comparative data; and
    comparing a result of the multivariate analysis for comparison with a result of the multivariate analysis for reference to detect the abnormality of the comparative processing system on the basis of a difference therebetween.

27. A processing system control unit as set forth in claim 26, wherein at least voltage, current, impedance and phase angle of a fundamental wave and higher harmonic waves are used as the electrical data.

28. A processing system control unit as set forth in claim 26, wherein the multivariate analysis is a principal component analysis.

29. A processing system control unit as set forth in claim 28, wherein a residual score is used as the result of the principal component analysis.

30. A processing system control unit as set forth in claim 28, wherein a cause of abnormality of the processing system is distinguished on the basis of components of a residual matrix obtained by the principal component analysis.

* * * * *